United States Patent
Chen et al.

(10) Patent No.: US 11,175,354 B2
(45) Date of Patent: Nov. 16, 2021

(54) APPARATUS AND METHOD FOR SCANNING ARTIFICIAL STRUCTURE

(71) Applicant: National Central University, Taoyuan (TW)

(72) Inventors: Chien-Chih Chen, Taoyuan (TW); Yi-Chen Chu, Taoyuan (TW); Yung-Chieh Chuang, Taoyuan (TW)

(73) Assignee: NATIONAL CENTRAL UNIVERSITY, Taoyuan (TW)

( * ) Notice: Subject to any disclaimer, the term of this patent is extended or adjusted under 35 U.S.C. 154(b) by 143 days.

(21) Appl. No.: 16/593,018

(22) Filed: Oct. 4, 2019

(65) Prior Publication Data

US 2020/0110139 A1    Apr. 9, 2020

(30) Foreign Application Priority Data

Oct. 5, 2018  (TW) .................................. 107135296
Oct. 5, 2018  (TW) .................................. 107213565
Sep. 11, 2019 (TW) .................................. 108132837

(51) Int. Cl.
| | | |
|---|---|---|
| *G01R 33/00* | (2006.01) | |
| *G01R 33/038* | (2006.01) | |
| *G01R 33/06* | (2006.01) | |
| *E21B 47/0224* | (2012.01) | |
| *E21B 47/0232* | (2012.01) | |

(52) U.S. Cl.
CPC ...... *G01R 33/0094* (2013.01); *E21B 47/0224* (2020.05); *E21B 47/0232* (2020.05); *G01R 33/0047* (2013.01); *G01R 33/0385* (2013.01); *G01R 33/066* (2013.01)

(58) Field of Classification Search
CPC ............ G01R 33/0094; G01R 33/0047; G01R 33/0385; G01R 33/066; G01R 33/00; G01R 33/0035; G01R 33/0023; G01R 33/0017; G01R 31/3191; E21B 47/0232;
(Continued)

(56) References Cited

U.S. PATENT DOCUMENTS 6,865,455 B1 *  3/2005  Wiegert ............... G05D 1/0259
                                                      324/246
6,888,353 B1 *  5/2005  Wiegert ................... G01V 3/15
                                                      324/244
(Continued)

*Primary Examiner* — Patrick Assouad
*Assistant Examiner* — Taqi R Nasir
(74) *Attorney, Agent, or Firm* — Muncy, Geissler, Olds & Lowe, P.C.

(57) ABSTRACT

A method for scanning artificial structure, wherein a scanning artificial structure apparatus comprises four magnetic-field sensors, the four magnetic-field sensors are non-coplanar configured, the method comprises following steps of: moving the scanning artificial structure apparatus along a scanning path within a to-be-tested area, in the meantime, measuring magnetic field by the four magnetic-field sensors, and recording a position sequence when measuring magnetic field, wherein four magnetic-field measurement sequences are measured by the four magnetic-field sensors; and calculating a magnetic-field variation distribution from the four magnetic-field measurement sequences and the position sequence, wherein the magnetic-field variation distribution is corresponding to at least one artificial structure distribution.

20 Claims, 8 Drawing Sheets

(58) Field of Classification Search
CPC ..... E21B 47/0224; G01B 7/004; G01C 17/38; G06F 3/017; G06F 3/0346; G06F 3/012
See application file for complete search history.

(56) References Cited

U.S. PATENT DOCUMENTS

| | | | |
|---|---|---|---|
| 7,038,458 B1* | 5/2006 | Wiegert | G01V 3/081 324/244 |
| 2016/0020504 A1* | 1/2016 | Michaelis | H01Q 1/125 342/359 |
| 2017/0315094 A1* | 11/2017 | Timmons | G01N 17/006 |

* cited by examiner

APPARATUS AND METHOD FOR SCANNING ARTIFICIAL STRUCTURE

FIELD OF THE INVENTION

The present invention is related to an apparatus and method for scanning artificial structure, especially an apparatus with at least four non-coplanar configured magnetic field sensors and method for scanning artificial structure.

BACKGROUND OF THE INVENTION

Please refer to FIG. 12, which is a schematic view showing the conventional technology measuring the magnetic field. The conventional technology is applied to accurately measure a geomagnetic field BEarth (vector field). However, since measuring magnetic field is very easily interfered, the conventional technology suspends a precision magnetic field measuring instrument 91 under a helicopter 90, and the precision magnetic field measuring instrument 91 is suspended by the helicopter 90 to perform magnetic field measurement in the area to be tested. The length of the suspension should be long enough to prevent the measurement data of the precision magnetic field measuring instrument 91 from interfered by the inductive magnetic field of the helicopter 90. And the high precision magnetic field measuring instrument 91 is required to accurately measure the magnetic field. It costs a lot. However, the artificial structure on the ground generates an artificial structure magnetic field BArtificial (vector field) due to induction. Especially when the artificial structure includes a material with a conductor, it is more likely to generate the artificial structure magnetic field BArtificial due to induction. Therefore, in the conventional technology, when measuring the magnetic field, the precision magnetic field measuring instrument needs to have a certain height from the ground to avoid the influence of the artificial structure magnetic field BArtificial generated by some objects on the ground, especially the artificial structure.

Generally, when carrying out road pavement excavation or excavation work in some construction areas, it is often encountered that some pipelines are accidentally dug. Occasionally, it is very dangerous to accidentally dig into a gas pipeline. How to find out whether there are pipelines in the underground before construction mining, this has always been an unsolvable problem. Although conventional technology can measure the magnetic field very accurately, the magnetic field measurement (vector) measured by the high precision magnetic field measuring instrument 91 of conventional technology is the sum of the artificial structure magnetic field BArtificial and the geomagnetic field BEarth of the measured position. However conventional technology cannot tell from the magnitude and the direction of the component of the geomagnetic field BEarth and the magnitude and the direction of the component of the artificial structure magnetic field BArtificial of the magnetic field measurement (vector) measured by the high precision magnetic field measuring instrument 91. Hence conventional technology cannot be applied to measure the artificial structure magnetic field BArtificial generated by the artificial structure under the ground, therefore, it cannot be applied to measure the structure of artificial structure under the ground.

Accordingly, the present invention has developed a new design which may avoid the above mentioned drawbacks, may significantly enhance the performance of the devices and may take into account economic considerations. Therefore, the present invention then has been invented.

SUMMARY OF THE INVENTION

The main technical problem that the present invention is seeking to solve is to provide an apparatus and method for scanning artificial structure to scan the artificial structure under the ground to avoid excavation to the artificial structure under the ground.

In order to solve the problems mentioned the above and to achieve the expected effect, the present invention provides a method for scanning artificial structure, wherein a scanning artificial structure apparatus comprises a magnetic field sensing portion, wherein the magnetic field sensing portion comprises a first magnetic field sensor, a second magnetic field sensor, a third magnetic field sensor, and a fourth magnetic field sensor, wherein the first magnetic field sensor, the second magnetic field sensor, the third magnetic field sensor, and the fourth magnetic field sensor are non-coplanar configured, the method comprises following steps of: Step A: moving the scanning artificial structure apparatus along a scanning path within a to-be-tested area, in the meantime, measuring magnetic field by the first magnetic field sensor, the second magnetic field sensor, the third magnetic field sensor, and the fourth magnetic field sensor respectively, and recording a position sequence, wherein a first magnetic field measurement sequence is measured by the first magnetic field sensor, a second magnetic field measurement sequence is measured by the second magnetic field sensor, a third magnetic field measurement sequence is measured by the third magnetic field sensor, and a fourth magnetic field measurement sequence is measured by the fourth magnetic field sensor; and Step B: calculating a magnetic field variation distribution from the first magnetic field measurement sequence, the second magnetic field measurement sequence, the third magnetic field measurement sequence, the fourth magnetic field measurement sequence, and the position sequence, wherein the magnetic field variation distribution is corresponding to at least one artificial structure distribution.

In an embodiment, the method further comprises a following step of: Step A0: measuring an instrument magnetic field by the first magnetic field sensor, the second magnetic field sensor, the third magnetic field sensor, and the fourth magnetic field sensor respectively, wherein the instrument magnetic field is generated by the scanning artificial structure apparatus, wherein a first instrument magnetic field measurement is measured by the first magnetic field sensor, a second instrument magnetic field measurement is measured by the second magnetic field sensor, a third instrument magnetic field measurement is measured by the third magnetic field sensor, and a fourth instrument magnetic field measurement is measured by the fourth magnetic field sensor; wherein in the Step B, the magnetic field variation distribution is calculated from a subtraction of the first instrument magnetic field measurement from the first magnetic field measurement sequence, a subtraction of the second instrument magnetic field measurement from the second magnetic field measurement sequence, a subtraction of the third instrument magnetic field measurement from the third magnetic field measurement sequence, a subtraction of the fourth instrument magnetic field measurement from the fourth magnetic field measurement sequence, and the position sequence; wherein the method is executed in following sequence: (1) the Step A0, the Step A, and the Step B, or (2) the Step A, the Step A0, and the Step B.

In an embodiment, wherein the Step B comprises following steps of: calculating a first magnetic field measurement distribution from the position sequence and a subtraction of the first instrument magnetic field measurement from the first magnetic field measurement sequence; calculating a second magnetic field measurement distribution from the position sequence and a subtraction of the second instrument magnetic field measurement from the second magnetic field measurement sequence; calculating a third magnetic field measurement distribution from the position sequence and a subtraction of the third instrument magnetic field measurement from the third magnetic field measurement sequence; calculating a fourth magnetic field measurement distribution from the position sequence and a subtraction of the fourth instrument magnetic field measurement from the fourth magnetic field measurement sequence; and calculating the magnetic field variation distribution from the first magnetic field measurement distribution, the second magnetic field measurement distribution, the third magnetic field measurement distribution, and the fourth magnetic field measurement distribution.

In an embodiment, wherein the magnetic field sensing portion further comprises a fifth magnetic field sensor, a sixth magnetic field sensor, a seventh magnetic field sensor, and an eighth magnetic field sensor, wherein the Step A further comprises a following step of: measuring magnetic field by the fifth magnetic field sensor, the sixth magnetic field sensor, the seventh magnetic field sensor, and the eighth magnetic field sensor respectively during moving the scanning artificial structure apparatus, wherein a fifth magnetic field measurement sequence is measured by the fifth magnetic field sensor, a sixth magnetic field measurement sequence is measured by the sixth magnetic field sensor, a seventh magnetic field measurement sequence is measured by the seventh magnetic field sensor, and an eighth magnetic field measurement sequence is measured by the eighth magnetic field sensor; wherein the Step B, the magnetic field variation distribution is calculated from the first magnetic field measurement sequence, the second magnetic field measurement sequence, the third magnetic field measurement sequence, the fourth magnetic field measurement sequence, the fifth magnetic field measurement sequence, the sixth magnetic field measurement sequence, the seventh magnetic field measurement sequence, the eighth magnetic field measurement sequence, and the position sequence.

In an embodiment, the method further comprises a following step of: Step A0: measuring an instrument magnetic field by the first magnetic field sensor, the second magnetic field sensor, the third magnetic field sensor, the fourth magnetic field sensor, the fifth magnetic field sensor, the sixth magnetic field sensor, the seventh magnetic field sensor, and the eighth magnetic field sensor respectively, wherein the instrument magnetic field is generated by the scanning artificial structure apparatus, wherein a first instrument magnetic field measurement is measured by the first magnetic field sensor, a second instrument magnetic field measurement is measured by the second magnetic field sensor, a third instrument magnetic field measurement is measured by the third magnetic field sensor, a fourth instrument magnetic field measurement is measured by the fourth magnetic field sensor, a fifth instrument magnetic field measurement is measured by the fifth magnetic field sensor, a sixth instrument magnetic field measurement is measured by the sixth magnetic field sensor, a seventh instrument magnetic field measurement is measured by the seventh magnetic field sensor, and an eighth instrument magnetic field measurement is measured by the eighth magnetic field sensor; wherein in the Step B, the magnetic field variation distribution is calculated from a subtraction of the first instrument magnetic field measurement from the first magnetic field measurement sequence, a subtraction of the second instrument magnetic field measurement from the second magnetic field measurement sequence, a subtraction of the third instrument magnetic field measurement from the third magnetic field measurement sequence, a subtraction of the fourth instrument magnetic field measurement from the fourth magnetic field measurement sequence, a subtraction of the fifth instrument magnetic field measurement from the fifth magnetic field measurement sequence, a subtraction of the sixth instrument magnetic field measurement from the sixth magnetic field measurement sequence, a subtraction of the seventh instrument magnetic field measurement from the seventh magnetic field measurement sequence, a subtraction of the eighth instrument magnetic field measurement from the eighth magnetic field measurement sequence, and the position sequence; wherein the method is executed in following sequence: (1) the Step A0, the Step A, and the Step B, or (2) the Step A, the Step A0, and the Step B.

In an embodiment, wherein in the Step A0, measuring the instrument magnetic field by the first magnetic field sensor comprises following steps of: Step A11: rotating the scanning artificial structure apparatus around a first axis of the first magnetic field sensor by at least 180 degrees, in the meantime, measuring magnetic field by the first magnetic field sensor, wherein a first-magnetic-field-sensor-first-axis measurement sequence is measured by the first magnetic field sensor; Step A12: rotating the scanning artificial structure apparatus around a second axis of the first magnetic field sensor by at least 180 degrees, in the meantime, measuring magnetic field by the first magnetic field sensor, wherein a first-magnetic-field-sensor-second-axis measurement sequence is measured by the first magnetic field sensor, wherein the first axis of the first magnetic field sensor and the second axis of the first magnetic field sensor are orthogonal; and Step A13: calculating the first instrument magnetic field measurement from the first-magnetic-field-sensor-first-axis measurement sequence and the first-magnetic-field-sensor-second-axis measurement sequence; wherein measuring the instrument magnetic field by the second magnetic field sensor comprises following steps of: Step A21: rotating the scanning artificial structure apparatus around a first axis of the second magnetic field sensor by at least 180 degrees, in the meantime, measuring magnetic field by the second magnetic field sensor, wherein a second-magnetic-field-sensor-first-axis measurement sequence is measured by the second magnetic field sensor; Step A22: rotating the scanning artificial structure apparatus around a second axis of the second magnetic field sensor by at least 180 degrees, in the meantime, measuring magnetic field by the second magnetic field sensor, wherein a second-magnetic-field-sensor-second-axis measurement sequence is measured by the second magnetic field sensor, wherein the first axis of the second magnetic field sensor and the second axis of the second magnetic field sensor are orthogonal; and Step A23: calculating the second instrument magnetic field measurement from the second-magnetic-field-sensor-first-axis measurement sequence and the second-magnetic-field-sensor-second-axis measurement sequence; wherein measuring the instrument magnetic field by the third magnetic field sensor comprises following steps of: Step A31: rotating the scanning artificial structure apparatus around a first axis of the third magnetic field sensor by at least 180 degrees, in the meantime, measuring magnetic field by the third magnetic field sensor, wherein a third-magnetic-field-sensor-first-axis measurement sequence is measured by the third magnetic field sensor; Step A32: rotating the scanning artificial structure apparatus around a second axis of the third magnetic field sensor by at least 180 degrees, in the meantime, measuring magnetic field by the third magnetic field sensor, wherein a third-magnetic-field-sensor-second-axis measurement sequence is measured by the third magnetic field sensor, wherein the first axis of the third magnetic field sensor and the second axis of the third magnetic field sensor are orthogonal; and Step A33: calculating the third instrument magnetic field measurement from the third-magnetic-field-sensor-first-axis measurement sequence and the third-magnetic-field-sensor-second-axis measurement sequence; wherein measuring the instrument magnetic field by the fourth magnetic field sensor comprises following steps of: Step A41: rotating the scanning artificial structure apparatus around a first axis of the fourth magnetic field sensor by at least 180 degrees, in the meantime, measuring magnetic field by the fourth magnetic field sensor, wherein a fourth-magnetic-field-sensor-first-axis measurement sequence is measured by the fourth magnetic field sensor; Step A42: rotating the scanning artificial structure apparatus around a second axis of the fourth magnetic field sensor by at least 180 degrees, in the meantime, measuring magnetic field by the fourth magnetic field sensor, wherein a fourth-magnetic-field-sensor-second-axis measurement sequence is measured by the fourth magnetic field sensor, wherein the first axis of the fourth magnetic field sensor and the second axis of the fourth magnetic field sensor are orthogonal; and Step A43: calculating the fourth instrument magnetic field measurement from the fourth-magnetic-field-sensor-first-axis measurement sequence and the fourth-magnetic-field-sensor-second-axis measurement sequence.

In an embodiment, wherein in the Step A0, measuring the instrument magnetic field by the fifth magnetic field sensor comprises following steps of: Step A51: rotating the scanning artificial structure apparatus around a first axis of the fifth magnetic field sensor by at least 180 degrees, in the meantime, measuring magnetic field by the fifth magnetic field sensor, wherein a fifth-magnetic-field-sensor-first-axis measurement sequence is measured by the fifth magnetic field sensor; Step A52: rotating the scanning artificial structure apparatus around a second axis of the fifth magnetic field sensor by at least 180 degrees, in the meantime, measuring magnetic field by the fifth magnetic field sensor, wherein a fifth-magnetic-field-sensor-second-axis measurement sequence is measured by the fifth magnetic field sensor, wherein the first axis of the fifth magnetic field sensor and the second axis of the fifth magnetic field sensor are orthogonal; and Step A53: calculating the fifth instrument magnetic field measurement from the fifth-magnetic-field-sensor-first-axis measurement sequence and the fifth-magnetic-field-sensor-second-axis measurement sequence; wherein measuring the instrument magnetic field by the sixth magnetic field sensor comprises following steps of: Step A61: rotating the scanning artificial structure apparatus around a first axis of the sixth magnetic field sensor by at least 180 degrees, in the meantime, measuring magnetic field by the sixth magnetic field sensor, wherein a sixth-magnetic-field-sensor-first-axis measurement sequence is measured by the sixth magnetic field sensor; Step A62: rotating the scanning artificial structure apparatus around a second axis of the sixth magnetic field sensor by at least 180 degrees, in the meantime, measuring magnetic field by the sixth magnetic field sensor, wherein a sixth-magnetic-field-sensor-second-axis measurement sequence is measured by the sixth magnetic field sensor, wherein the first axis of the sixth magnetic field sensor and the second axis of the sixth magnetic field sensor are orthogonal; and Step A63: calculating the sixth instrument magnetic field measurement from the sixth-magnetic-field-sensor-first-axis measurement sequence and the sixth-magnetic-field-sensor-second-axis measurement sequence; wherein measuring the instrument magnetic field by the seventh magnetic field sensor comprises following steps of: Step A71: rotating the scanning artificial structure apparatus around a first axis of the seventh magnetic field sensor by at least 180 degrees, in the meantime, measuring magnetic field by the seventh magnetic field sensor, wherein a seventh-magnetic-field-sensor-first-axis measurement sequence is measured by the seventh magnetic field sensor; Step A72: rotating the scanning artificial structure apparatus around a second axis of the seventh magnetic field sensor by at least 180 degrees, in the meantime, measuring magnetic field by the seventh magnetic field sensor, wherein a seventh-magnetic-field-sensor-second-axis measurement sequence is measured by the seventh magnetic field sensor, wherein the first axis of the seventh magnetic field sensor and the second axis of the seventh magnetic field sensor are orthogonal; and Step A73: calculating the seventh instrument magnetic field measurement from the seventh-magnetic-field-sensor-first-axis measurement sequence and the seventh-magnetic-field-sensor-second-axis measurement sequence; wherein measuring the instrument magnetic field by the eighth magnetic field sensor comprises following steps of: Step A81: rotating the scanning artificial structure apparatus around a first axis of the eighth magnetic field sensor by at least 180 degrees, in the meantime, measuring magnetic field by the eighth magnetic field sensor, wherein an eighth-magnetic-field-sensor-first-axis measurement sequence is measured by the eighth magnetic field sensor; Step A82: rotating the scanning artificial structure apparatus around a second axis of the eighth magnetic field sensor by at least 180 degrees, in the meantime, measuring magnetic field by the eighth magnetic field sensor, wherein an eighth-magnetic-field-sensor-second-axis measurement sequence is measured by the eighth magnetic field sensor, wherein the first axis of the eighth magnetic field sensor and the second axis of the eighth magnetic field sensor are orthogonal; and Step A83: calculating the eighth instrument magnetic field measurement from the eighth-magnetic-field-sensor-first-axis measurement sequence and the eighth-magnetic-field-sensor-second-axis measurement sequence.

In an embodiment, wherein the Step B comprises following steps of: calculating a first magnetic field measurement distribution from the position sequence and a subtraction of the first instrument magnetic field measurement from the first magnetic field measurement sequence; calculating a second magnetic field measurement distribution from the position sequence and a subtraction of the second instrument magnetic field measurement from the second magnetic field measurement sequence; calculating a third magnetic field measurement distribution from the position sequence and a subtraction of the third instrument magnetic field measurement from the third magnetic field measurement sequence; calculating a fourth magnetic field measurement distribution from the position sequence and a subtraction of the fourth instrument magnetic field measurement from the fourth magnetic field measurement sequence; calculating a fifth magnetic field measurement distribution from the position sequence and a subtraction of the fifth instrument magnetic field measurement from the fifth magnetic field measurement sequence; calculating a sixth magnetic field measurement distribution from the position sequence and a subtraction of the sixth instrument magnetic field measurement from the sixth magnetic field measurement sequence; calculating a seventh magnetic field measurement distribution from the position sequence and a subtraction of the seventh instrument magnetic field measurement from the seventh magnetic field measurement sequence; and calculating an eighth magnetic field measurement distribution from the position sequence and a subtraction of the eighth instrument magnetic field measurement from the eighth magnetic field measurement sequence; and calculating the magnetic field variation distribution from the first magnetic field measurement distribution, the second magnetic field measurement distribution, the third magnetic field measurement distribution, the fourth magnetic field measurement distribution, the fifth magnetic field measurement distribution, the sixth magnetic field measurement distribution, the seventh magnetic field measurement distribution, and the eighth magnetic field measurement distribution.

In an embodiment, wherein the first magnetic field sensor, the second magnetic field sensor, the third magnetic field sensor, the fourth magnetic field sensor, the fifth magnetic field sensor, the sixth magnetic field sensor, the seventh magnetic field sensor, and the eighth magnetic field sensor are located respectively at eight vertices of a parallelepiped, located respectively at eight vertices of a cuboid, or located respectively at eight vertices of a regular hexahedron.

In an embodiment, wherein the first magnetic field sensor, the second magnetic field sensor, the third magnetic field sensor, and the fourth magnetic field sensor are located respectively at four vertices of an equilateral-triangle-based pyramid or located respectively at four vertices of a regular tetrahedron.

In an embodiment, wherein the magnetic field variation distribution is a magnetic field gradient-vector distribution, a magnetic field gradient-vector-magnitude distribution, a magnetic field gradient-vector-horizontal-component distribution, or a magnetic field gradient-vector-horizontal-component-magnitude distribution.

In an embodiment, the scanning artificial structure apparatus further comprises a positioning portion.

In an embodiment, wherein the positioning portion is one selected from the group consisting of: a ranging wheel, a distance measuring equipment, a rule, a measuring tape, a laser positioning device, an ultrasonic positioning device, a radar wave positioning device, a GPS positioning device, and an image positioning device.

The present invention further provides a scanning artificial structure apparatus (scanning artificial structure apparatus), which comprises a magnetic field sensing portion. The magnetic field sensing portion comprises a first magnetic field sensor, a second magnetic field sensor, a third magnetic field sensor, and a fourth magnetic field sensor, wherein the first magnetic field sensor, the second magnetic field sensor, the third magnetic field sensor, and the fourth magnetic field sensor are non-coplanar configured. The scanning artificial structure apparatus is for performing the method for scanning artificial structure described the above.

In an embodiment, wherein the magnetic field sensing portion further comprises a fifth magnetic field sensor, a sixth magnetic field sensor, a seventh magnetic field sensor, and an eighth magnetic field sensor.

In an embodiment, wherein the first magnetic field sensor, the second magnetic field sensor, the third magnetic field sensor, the fourth magnetic field sensor, the fifth magnetic field sensor, the sixth magnetic field sensor, the seventh magnetic field sensor, and the eighth magnetic field sensor are located respectively at eight vertices of a parallelepiped, located respectively at eight vertices of a cuboid, or located respectively at eight vertices of a regular hexahedron.

In an embodiment, wherein the first magnetic field sensor, the second magnetic field sensor, the third magnetic field sensor, and the fourth magnetic field sensor are located respectively at four vertices of an equilateral-triangle-based pyramid or located respectively at four vertices of a regular tetrahedron.

In an embodiment, the scanning artificial structure apparatus further comprises a positioning portion.

In an embodiment, wherein the positioning portion is one selected from the group consisting of: a ranging wheel, a distance measuring equipment, a rule, a measuring tape, a laser positioning device, an ultrasonic positioning device, a radar wave positioning device, a GPS positioning device, and an image positioning device.

In an embodiment, the scanning artificial structure apparatus further comprises a moving portion.

For further understanding the characteristics and effects of the present invention, some preferred embodiments referred to drawings are in detail described as follows.

DETAILED DESCRIPTIONS OF PREFERRED EMBODIMENTS

Figure 1:
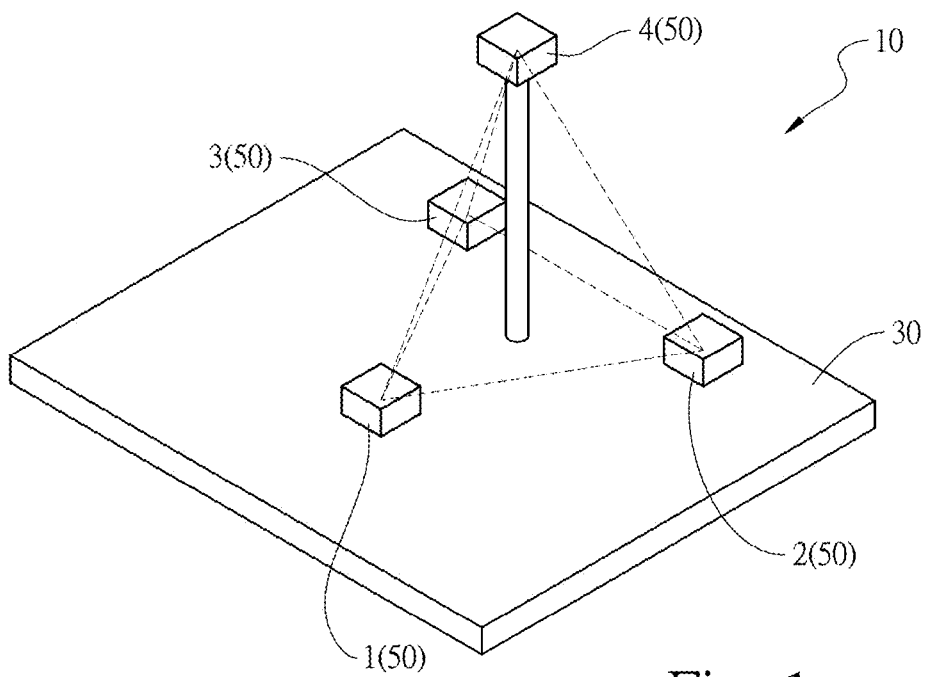
FIG. 1 is a schematic perspective view showing an embodiment of a scanning artificial structure apparatus of the present invention.
Figure 2:
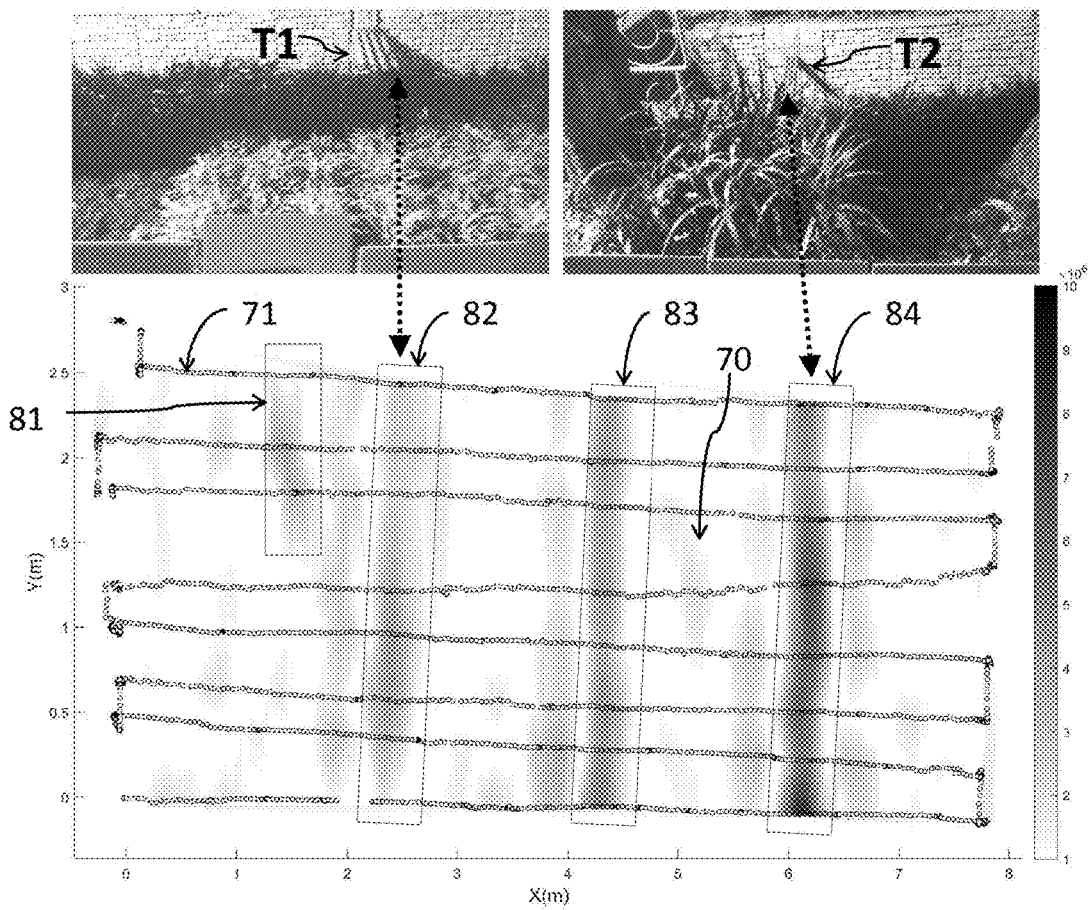
FIG. 2 is a schematic view showing the scanning path and the magnetic field variation distribution within the to-be-tested area and the corresponding artificial structure distribution.

Please refer to FIG. 1, which is a schematic perspective view showing an embodiment of a scanning artificial structure apparatus of the present invention. The present invention provides a scanning artificial structure apparatus (scanning artificial structure apparatus) 10 comprising a carrier portion 30 and a magnetic field sensing portion 50. The the magnetic field sensing portion 50 are configured on the carrier portion 30. The magnetic field sensing portion 50 is used for measuring the magnetic field. The magnetic field sensing portion 50 comprises a first magnetic field sensor (first magnetic field sensor) 1, a second magnetic field sensor (second magnetic field sensor) 2, a third magnetic field sensor (third magnetic field sensor) 3, and a fourth magnetic field sensor (fourth magnetic field sensor) 4, wherein the first magnetic field sensor 1, the second magnetic field sensor 2, the third magnetic field sensor 3, and the fourth magnetic field sensor 4 are non-coplanar configured. In current embodiment, the carrier portion 30 of the scanning artificial structure apparatus is made of materials that avoid the generation of induced magnetic fields, such as plastic, or some non-metal materials. Since an artificial structure will generate an artificial structure magnetic field BArtificial (vector field) due to induction. Especially when the artificial structure includes an electrically conductive material, it is more likely to generate the artificial structure magnetic field BArtificial due to induction. When scanning the artificial structure by the scanning artificial structure apparatus 10, for any of the magnetic field sensors, the measured magnetic field measurement (vector) is the sum of the artificial structure magnetic field BArtificial and the geomagnetic field BEarth of the measured position. The source of the geomagnetic field BEarth is very far away from the first magnetic field sensor 1, the second magnetic field sensor 2, the third magnetic field sensor 3, and the fourth magnetic field sensor 4 of the scanning artificial structure apparatus 10. If consider the geomagnetic field BEarth is a magnetic dipole, one of the poles is located near the geographic North Pole, while the other is located near the geographic South Pole. Relatively speaking, the source of the artificial structure magnetic field BArtificial is relatively much closer to the first magnetic field sensor 1, the second magnetic field sensor 2, the third magnetic field sensor 3, and the fourth magnetic field sensor 4 of the scanning artificial structure apparatus 10. Since the first magnetic field sensor 1, the second magnetic field sensor 2, the third magnetic field sensor 3, and the fourth magnetic field sensor 4 are non-coplanar configured, using different magnetic field sensor to measure magnetic field. Therefore, the components of the geomagnetic field BEarth of the magnetic field measurements measured by different magnetic field sensors (including the components of the geomagnetic field BEarth and the components of the artificial structure magnetic field BArtificial) are almost the same, while the components of the artificial structure magnetic field BArtificial of the magnetic field measurements may be different. Please also refer to FIG. 2, which is a schematic view showing the scanning path and the magnetic field variation distribution within the to-be-tested area and the corresponding artificial structure distribution. The present invention provides a method for scanning artificial structure, which comprises following steps of: Step A: moving the scanning artificial structure apparatus 10 along a scanning path 71 within a to-be-tested area 70, in the meantime, measuring magnetic field by the first magnetic field sensor 1, the second magnetic field sensor 2, the third magnetic field sensor 3, and the fourth magnetic field sensor 4 respectively, and recording a position sequence [PS], wherein a first magnetic field measurement sequence [BUC1] is measured by the first magnetic field sensor 1, a second magnetic field measurement sequence [BUC2] is measured by the second magnetic field sensor 2, a third magnetic field measurement sequence [BUC3] is measured by the third magnetic field sensor 3, and a fourth magnetic field measurement sequence [BUC4] is measured by the fourth magnetic field sensor 4; and Step B: calculating a magnetic field variation distribution BVarD from the first magnetic field measurement sequence [BUC1], the second magnetic field measurement sequence [BUC2], the third magnetic field measurement sequence [BUC3], the fourth magnetic field measurement sequence [BUC4], and the position sequence [PS]. Since the geomagnetic field BEarth will not significantly change within a short time period in a local area, and the source of the geomagnetic field BEarth is very far away from the first magnetic field sensor 1, the second magnetic field sensor 2, the third magnetic field sensor 3, and the fourth magnetic field sensor 4, hence, the components of the geomagnetic field BEarth measured by the first magnetic field sensor 1, the second magnetic field sensor 2, the third magnetic field sensor 3, and the fourth magnetic field sensor 4 are almost no difference. Since the source of the artificial structure magnetic field BArtificial is relatively much closer to the first magnetic field sensor 1, the second magnetic field sensor 2, the third magnetic field sensor 3, and the fourth magnetic field sensor 4; and the first magnetic field sensor 1, the second magnetic field sensor 2, the third magnetic field sensor 3, and the fourth magnetic field sensor 4 are non-coplanar configured, hence, at least two of the components of the artificial structure magnetic field BArtificial measured by the first magnetic field sensor 1, the second magnetic field sensor 2, the third magnetic field sensor 3, and the fourth magnetic field sensor 4 are difference regardless of the direction of the artificial structure magnetic field BArtificial. Therefore, the components of the artificial structure magnetic field BArtificial and also the components of the geomagnetic field BEarth can be calculated from the first magnetic field measurement sequence [BUC1], the second magnetic field measurement sequence [BUC2], the third magnetic field measurement sequence [BUC3], and the fourth magnetic field measurement sequence [BUC4] measured by the first magnetic field sensor 1, the second magnetic field sensor 2, the third magnetic field sensor 3, and the fourth magnetic field sensor 4. In current embodiments, the magnetic field variation distribution BVarD is a magnetic field gradient-vector-magnitude distribution (scalar) which combines the position sequence [PS] and a magnetic field gradient-vector-magnitude sequence (scalar sequence) calculated from the first magnetic field measurement sequence [BUC1], the second magnetic field measurement sequence [BUC2], the third magnetic field measurement sequence [BUC3], and the fourth magnetic field measurement sequence [BUC4]. The magnetic field variation distribution BVarD is corresponding to the artificial structure magnetic field BArtificial generated by the artificial structure due to induction. Hence, the magnetic field variation distribution BVarD is corresponding to an artificial structure distribution. Since the first magnetic field sensor 1, the second magnetic field sensor 2, the third magnetic field sensor 3, and the fourth magnetic field sensor 4 are non-coplanar configured in present invention, the magnetic field gradient along any direction can be calculated (if the first magnetic field sensor 1, the second magnetic field sensor 2, the third magnetic field sensor 3, and the fourth magnetic field sensor 4 are configured on a coplanar, then the magnetic field gradient along the direction of a normal of the coplanar cannot be calculated). In FIG. 2, the magnetic field variation distribution BVarD is demonstrated in grayscale color, wherein the darker the grayscale color, the greater the magnetic field variation. The four regions with larger the magnetic field variation are 81, 82, 83 and 84. This shows that there should be at least one corresponding artificial structure distribution under the regions 81, 82, 83 and 84 within the to-be-tested area 70. The photo on the left side above the FIG. 2 has metal water pipes T1, while the photo on the right side above the FIG. 2 has metal water pipes T2, wherein the metal water pipes T1 extend below the area corresponding to 82 within the to-be-tested area 70, wherein the metal water pipes T2 extend below the area corresponding to 84 within the to-be-tested area 70. Hence, the method for scanning artificial structure of the present invention can indeed scan the corresponding artificial structure distribution under the to-be-tested area 70, so as to facilitate the avoidance of these artificial structures during construction mining.

In some embodiments, the scanning artificial structure apparatus 10 can be selected to be moved by hand. In some embodiments, recording the position sequence [PS] of the measured positions can be achieved by a simple distance measuring tool, such as a ranging wheel, a distance measuring equipment, a rule, a measuring tape, or a laser positioning device, etc. In some embodiments, the scanning artificial structure apparatus 10 can be fixed on the handle of the ranging wheel so that recording the position sequence [PS] of the measured position while measuring magnetic field can be achieved. In some embodiments, the positions where magnetic field will be measured on the scanning path 71 within the to-be-tested area 70 can be planned in advanced and the position sequence [PS] can be obtained by measuring the distance between the adjacent positions in advance; and then the scanning artificial structure apparatus 10 is moved to these positions to measure magnetic field. In some embodiments, wheels can be mounted under the carrier portion 30 to facilitate stable movement of the scanning artificial structure apparatus 10, wherein the wheels are made of the materials that avoids the generation of the induced magnetic field. In some embodiments, the magnetic field variation distribution BVarD is a magnetic field gradient-vector distribution (vector) which combines the position sequence [PS] and a magnetic field gradient-vector sequence (vector sequence) calculated from the first magnetic field measurement sequence [BUC1], the second magnetic field measurement sequence [BUC2], the third magnetic field measurement sequence [BUC3], and the fourth magnetic field measurement sequence [BUC4]. In some embodiments, the magnetic field variation distribution BVarD is a magnetic field gradient-vector-horizontal-component distribution (vector) which combines the position sequence [PS] and a magnetic field gradient-vector-horizontal-component sequence (vector sequence) calculated from the first magnetic field measurement sequence [BUC1], the second magnetic field measurement sequence [BUC2], the third magnetic field measurement sequence [BUC3], and the fourth magnetic field measurement sequence [BUC4]. In some embodiments, the magnetic field variation distribution BVarD is a magnetic field gradient-vector-horizontal-component-magnitude distribution (scalar) which combines the position sequence [PS] and a magnetic field gradient-vector-horizontal-component-magnitude sequence (scalar sequence) calculated from the first magnetic field measurement sequence [BUC1], the second magnetic field measurement sequence [BUC2], the third magnetic field measurement sequence [BUC3], and the fourth magnetic field measurement sequence [BUC4]. To calculated the magnetic field variation distribution BVarD from the first magnetic field measurement sequence [BUC1], the second magnetic field measurement sequence [BUC2], the third magnetic field measurement sequence [BUC3], the fourth magnetic field measurement sequence [BUC4] and the position sequence [PS] of the measured positions are not limited to the above method. It is easy to calculate the magnetic field variation distribution BVarD when the first magnetic field measurement sequence [BUC1], the second magnetic field measurement sequence [BUC2], the third magnetic field measurement sequence [BUC3], the fourth magnetic field measurement sequence [BUC4] and the position sequence [PS] of the measured positions are known.

Figure 3:
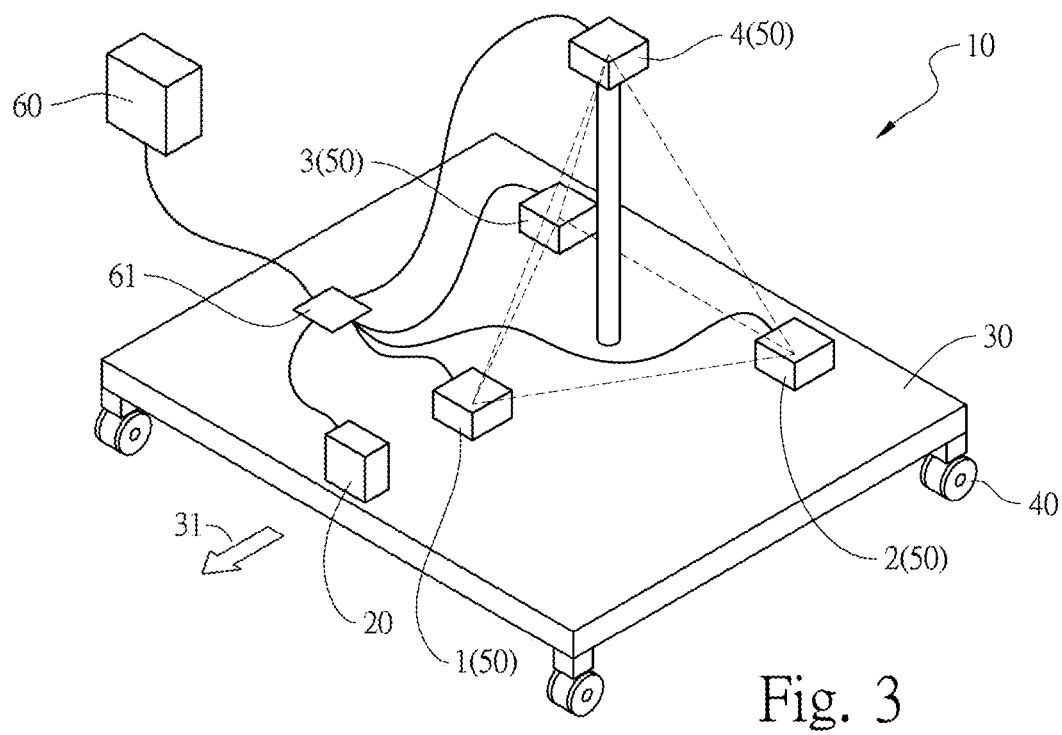
FIG. 3 is a schematic perspective view showing another embodiment of a scanning artificial structure apparatus of the present invention.
Figure 4:
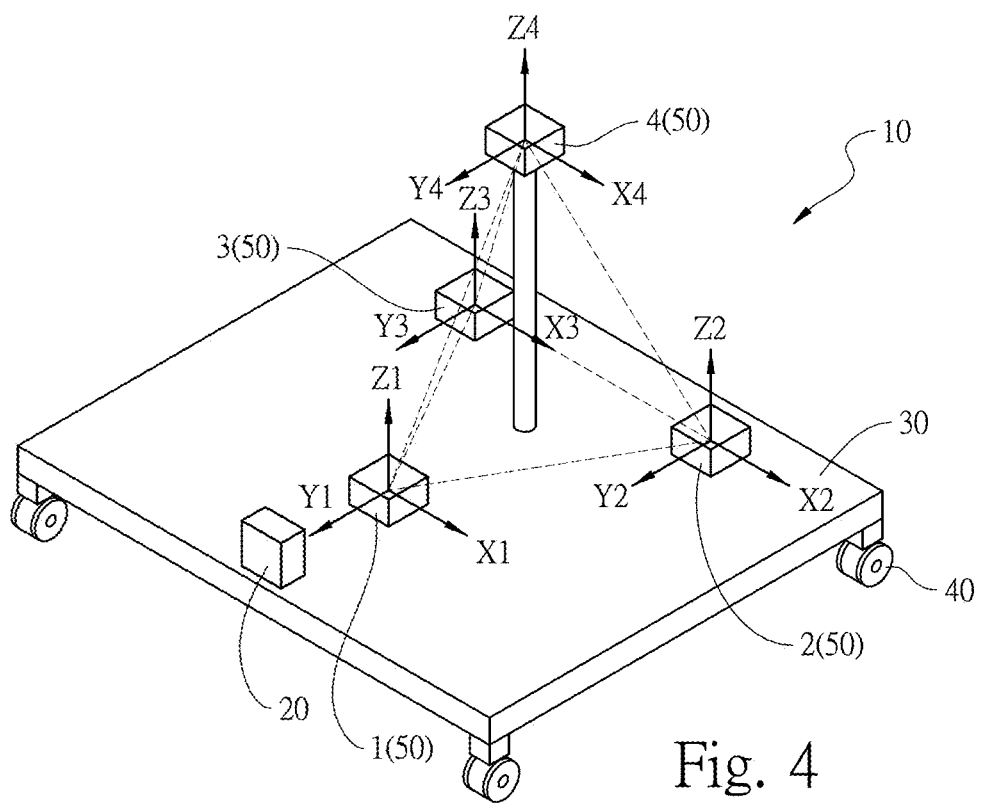
FIG. 4 is a schematic view showing three axes of each of the magnetic field sensors of the magnetic field sensing portion of the embodiment of the scanning artificial structure apparatus of FIG. 3.

Please refer to FIG. 3, which is a schematic perspective view showing another embodiment of a scanning artificial structure apparatus of the present invention. The main structure of the embodiment of FIG. 3 is basically the same as the structure of the embodiment of FIG. 1, except that it further comprises a connecting portion 61, a moving portion 40 and a positioning portion 20. The positioning portion 20 and the connecting portion 61 are configured on the carrier portion 30. The positioning portion 20 is used for positioning for recording the position sequence [PS]. A data processing portion 60 is connected to the connecting portion 61 by wire. The data processing portion 60 is connected to the first magnetic field sensor 1, the second magnetic field sensor 2, the third magnetic field sensor 3, and the fourth magnetic field sensor 4 by wire respectively via the connecting portion 61. The data processing portion 60 is used for recording the magnetic field data measured by the first magnetic field sensor 1, the second magnetic field sensor 2, the third magnetic field sensor 3, and the fourth magnetic field sensor 4 and the position data from the positioning portion 20 (or used for recording the data and processing the data). In current embodiment, the data processing portion 60 is configured outside the scanning artificial structure apparatus 10. The scanning artificial structure apparatus 10 has a front 31. The moving portion 40 is configured below the carrier portion 30. The moving portion 40 is used for moving the scanning artificial structure apparatus 10. The direction of the moving portion 40 can be turned so that the direction of the front 31 of the scanning artificial structure apparatus 10 can be turned. Please also refer to FIG. 4, which is a schematic view showing three axes of each of the magnetic field sensors of the magnetic field sensing portion of the embodiment of the scanning artificial structure apparatus of FIG. 3. Each of the magnetic field sensors of the magnetic field sensing portion 50 has three axes. For example, the first magnetic field sensor 1 has a X1 axis, a Y1 axis, and a Z1 axis; the second magnetic field sensor 2 has a X2 axis, a Y2 axis, and a Z2 axis; the third magnetic field sensor 3 has a X3 axis, a Y3 axis, and a Z3 axis; the fourth magnetic field sensor 4 has a X4 axis, a Y4 axis, and a Z4 axis. Usually the three axes of each of the magnetic field sensors of the magnetic field sensing portion 50 are marked on the magnetic field sensor before the magnetic field sensor is shipped for the convenience of users. In current embodiment, the moving portion 40 is the steerable wheels with motor power. The operation of the motor may generate a magnetic field. Hence, the scanning artificial structure apparatus 10 of the present invention may generate an instrument magnetic field BInst (vector field). When scanning the artificial structure by the scanning artificial structure apparatus 10, for any of the magnetic field sensors, the measured magnetic field measurement (vector) is the sum of the geomagnetic field BEarth, the artificial structure magnetic field BArtificial, and the instrument magnetic field BInst of the measured position. The instrument magnetic field BInst can cause interference to each of the magnetic field sensors of the magnetic field sensing portion 50. Therefore, the interference of the instrument magnetic field BInst to each of the magnetic field sensors of the magnetic field sensing portion 50 must be removed. Since the instrument magnetic field BInst is generated by the scanning artificial structure apparatus 10, when the direction of the front 31 of the scanning artificial structure apparatus 10 is changed, the direction of the instrument magnetic field BInst is changed. Since the first magnetic field sensor 1, the second magnetic field sensor 2, the third magnetic field sensor 3, and the fourth magnetic field sensor 4 are configured on the carrier portion 30 of the scanning artificial structure apparatus 10, when the direction of the front 31 of the scanning artificial structure apparatus 10 is changed, the directions of the X1 axis, the Y1 axis, and the Z1 axis of the first magnetic field sensor 1, the directions of the X2 axis, the Y2 axis, and the Z2 axis of the second magnetic field sensor 2, the directions of the X3 axis, the Y3 axis, and the Z3 axis of the third magnetic field sensor 3, and the directions of the X4 axis, the Y4 axis, and the Z4 axis of the fourth magnetic field sensor 4 are changed. Hence, no matter how the direction of the front 31 of the scanning artificial structure apparatus 10 is changed, for any of the magnetic field sensors of the magnetic field sensing portion 50, the instrument magnetic field BInst is always a constant vector (the magnitude and the direction are unchanged). However, for different magnetic field sensors of the magnetic field sensing portion 50, the measured values (vector) of the instrument magnetic field BInst (vector field) are different. Let the first magnetic field sensor 1, the second magnetic field sensor 2, the third magnetic field sensor 3 and the fourth magnetic field sensor 4 to measure the instrument magnetic field BInst, the measured values are a first instrument magnetic field measurement BInst1 (vector), a second instrument magnetic field measurement BInst2 (vector), a third instrument magnetic field measurement BInst3 (vector), and a fourth instrument magnetic field measurement BInst4 (vector), respectively. The first instrument magnetic field measurement BInst1, the second instrument magnetic field measurement BInst2, the third instrument magnetic field measurement BInst3, and the fourth instrument magnetic field measurement BInst4 are four different vectors. However, the geomagnetic field BEarth will not change when the direction of the front 31 of the scanning artificial structure apparatus 10 is changed. That is that, for example, when the direction of the front 31 of the scanning artificial structure apparatus 10 is changed from the East direction to the North direction (that is turning 90 degrees counterclockwise), the direction of the instrument magnetic field BInst is also turning 90 degrees counterclockwise; while the geomagnetic field BEarth will not change.

Figure 5:
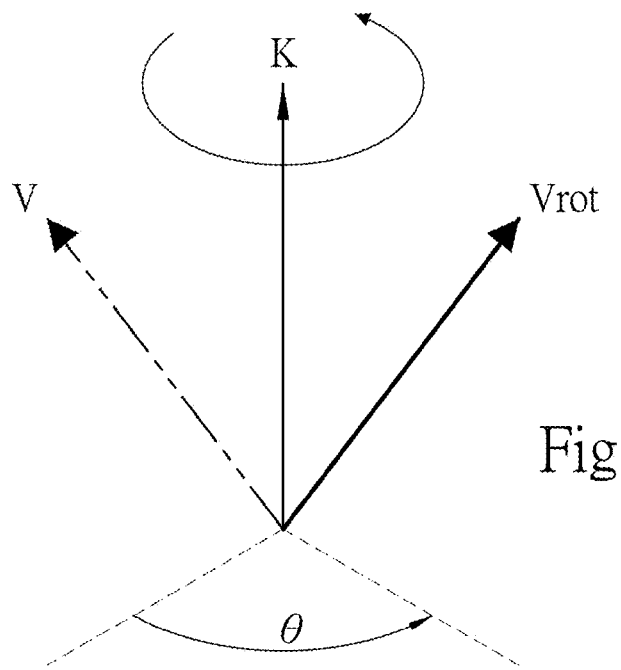
FIG. 5 is a schematic view showing the vector V rotates around the K axis by an angle θ.

Take advantage of this feature, if let the scanning artificial structure apparatus 10 rotate around the Z1 axis of the first magnetic field sensor 1 by an angle θ, from the perspective view of the first magnetic field sensor 1, the geomagnetic field BEarth is rotating around the Z1 axis of the first magnetic field sensor 1; while the instrument magnetic field BInst is a constant vector (will not rotate around the Z1 axis of the first magnetic field sensor 1). Please refer to FIG. 5, which is a schematic view showing the vector V rotates around the K axis by an angle θ. For the relation between the vector V and the vector $V_{rot}$ which is the vector V rotated around the K axis by the angle θ, please refer to Rodrigues' rotation equation:

$$V_{rot} = V\cos\theta + (K \times V)\sin\theta + K(K \cdot V)(1-\cos\theta) \quad \text{(equation 1)}$$

(wherein the vector V rotated around the K axis by the angle θ becomes the vector $V_{rot}$;
× is a cross product; · is a dot product)

Figure 6:
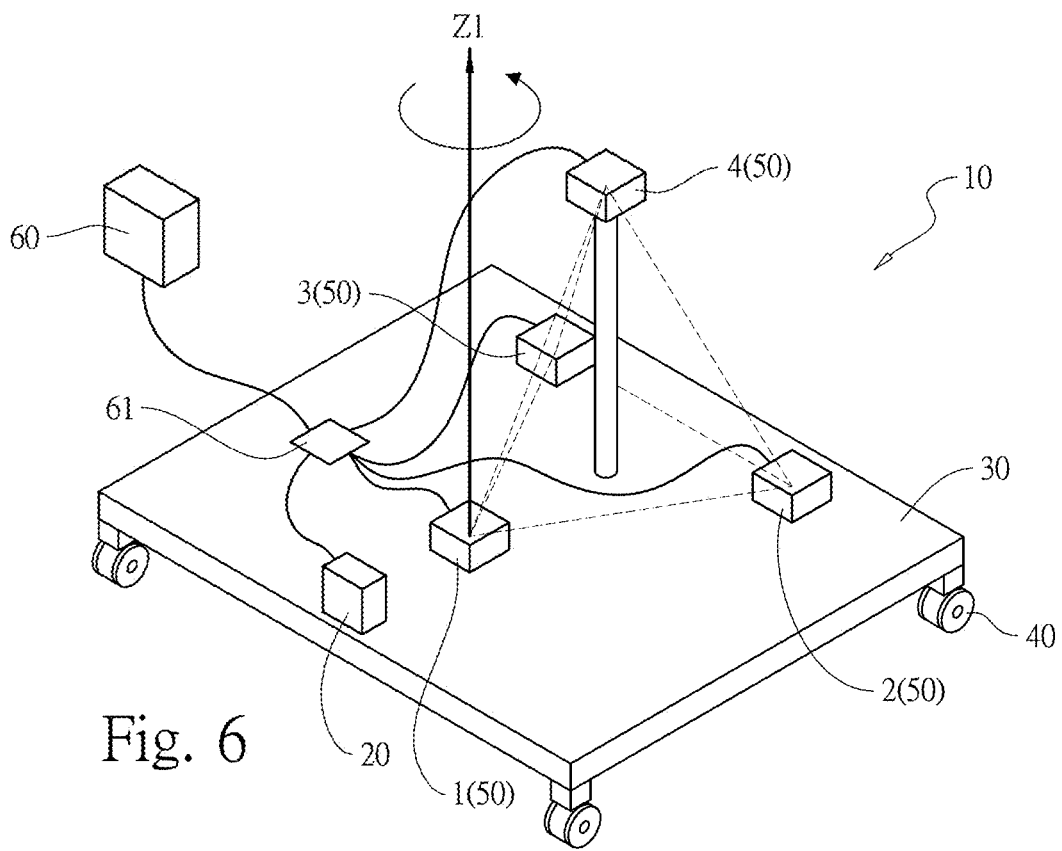
FIG. 6 is a schematic view showing the embodiment of the scanning artificial structure apparatus of FIG. 3 rotates around the Z1 axis of the first magnetic field sensor.

Please also refer to FIG. 6, which is a schematic view showing the embodiment of the scanning artificial structure apparatus of FIG. 3 rotates around the Z1 axis of the first magnetic field sensor. As shown in FIG. 6, when the scanning artificial structure apparatus 10 rotates around the Z1 axis (the first axis) of the first magnetic field sensor 1 by an angle θ, let the first magnetic field sensor 1 to measure the magnetic field, the measured value is as follows:

$$BZ1_{total\_\theta} = BEarth_{rotate\_Z1\_\theta} + BInst1 = \quad \text{(equation 2)}$$
$$(BEarth\cos\theta + (Z1 \times BEarth)\sin\theta +$$
$$Z1(Z1 \cdot BEarth)(1-\cos\theta)) + BInst1$$

Figure 7A:
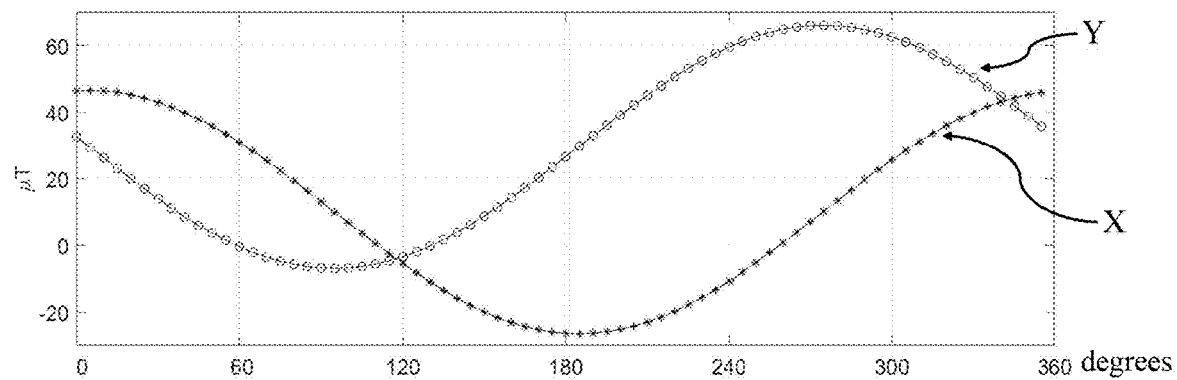
FIG. 7A is a graph showing the X1 axis component and the Y1 axis component of the magnetic field measured by the first magnetic field sensor during the embodiment of the scanning artificial structure apparatus of FIG. 3 rotating around the Z1 axis of the first magnetic field sensor.
Figure 7B:
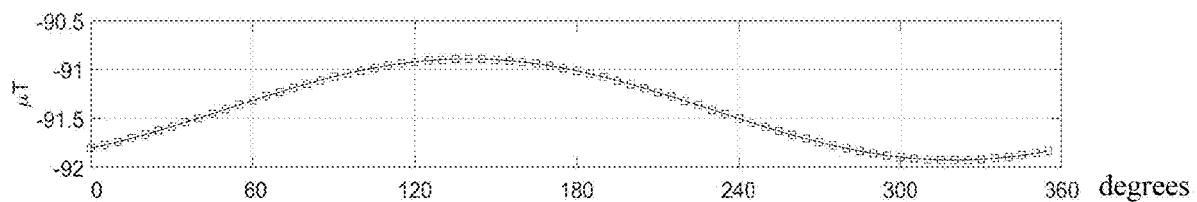
FIG. 7B is a graph showing the Z1 axis component of the magnetic field measured by the first magnetic field sensor during the embodiment of the scanning artificial structure apparatus of FIG. 3 rotating around the Z1 axis of the first magnetic field sensor.

In equation 2, a first-magnetic-field-sensor-first-axis measurement $BZ1_{total\_\theta}$ is the total magnetic field measurement (vector) measured by the first magnetic field sensor 1 when the scanning artificial structure apparatus 10 rotated around the Z1 axis of the first magnetic field sensor 1 by an angle θ. The first-magnetic-field-sensor-first-axis measurement $BZ1_{total\_\theta}$ is the sum of a component of the geomagnetic field BEarth and a component of the instrument magnetic field BInst. The component of the geomagnetic field BEarth is $BEarth_{rotate\_Z1\_\theta}$ (vector) which is measured by the first magnetic field sensor 1 when the scanning artificial structure apparatus 10 rotated around the Z1 axis of the first magnetic field sensor 1 by the angle θ. The component of the instrument magnetic field BInst is the first instrument magnetic field measurement BInst1 which is measured by the first magnetic field sensor 1 when the scanning artificial structure apparatus 10 rotated around the Z1 axis of the first magnetic field sensor 1 by the angle θ. In fact, no matter how much degree the scanning artificial structure apparatus 10 rotated around the Z1 axis of the first magnetic field sensor 1, the component of the instrument magnetic field BInst measured by the first magnetic field sensor 1 is always the first instrument magnetic field measurement BInst1. Take advantage of the above feature, the method for scanning artificial structure of the present invention further comprises a following step of: Step A0: measuring the instrument magnetic field BInst generated by the scanning artificial structure apparatus 10 by the first magnetic field sensor 1, the second magnetic field sensor 2, the third magnetic field sensor 3, and the fourth magnetic field sensor 4, respectively, wherein the first instrument magnetic field measurement BInst1, the second instrument magnetic field measurement BInst2, the third instrument magnetic field measurement BInst3, and the fourth instrument magnetic field measurement BInst4 are measured by the first magnetic field sensor 1, the second magnetic field sensor 2, the third magnetic field sensor 3, and the fourth magnetic field sensor 4. In the Step B, the magnetic field variation distribution BVarD is calculated from a subtraction of the first instrument magnetic field measurement BInst1 from the first magnetic field measurement sequence [BUC1], a subtraction of the second instrument magnetic field measurement BInst2 from the second magnetic field measurement sequence [BUC2], a subtraction of the third instrument magnetic field measurement BInst3 from the third magnetic field measurement sequence [BUC3], a subtraction of the fourth instrument magnetic field measurement BInst4 from the fourth magnetic field measurement sequence [BUC4], and the position sequence [PS]. Thereby the interference to the first magnetic field sensor 1, the second magnetic field sensor 2, the third magnetic field sensor 3, and the fourth magnetic field sensor 4 caused by the instrument magnetic field BInst can be removed, respectively. The method for scanning artificial structure of the present invention is executed in following sequence: (1) the Step A0, the Step A, and the Step B, or (2) the Step A, the Step A0, and the Step B. In the Step A0, to use the first magnetic field sensor 1 to measure the instrument magnetic field BInst generated by the scanning artificial structure apparatus 10 comprises following steps of: Step A11, Step A12, and Step A13. The Step A11: (as shown in FIG. 6) rotating the scanning artificial structure apparatus 10 around the first axis of the first magnetic field sensor 1 by at least 180 degrees (in current embodiment, the first axis of the first magnetic field sensor 1 may be the Z1 axis or an axis almost coincident with the Z1 axis), in the meantime, measuring magnetic field by the first magnetic field sensor 1, wherein a first-magnetic-field-sensor-first-axis measurement sequence [BZ1] (sequence of vectors) is measured by the first magnetic field sensor 1. During the scanning artificial structure apparatus 10 is rotating around the first axis of the first magnetic field sensor 1, the first-magnetic-field-sensor-first-axis measurement $BZ1_{total\_\theta}$ is measured by the first magnetic field sensor 1. At different angle θ, the first-magnetic-field-sensor-first-axis measurement $BZ1_{total\_\theta}$ measured by the first magnetic field sensor 1 is different. The first-magnetic-field-sensor-first-axis measurement sequence [BZ1] is a sequence composed of the first-magnetic-field-sensor-first-axis measurements $BZ1_{total\_\theta}$ (with different angle θ). Please also refer to FIGS. 7A and 7B, which are the graphs showing the X1 axis component, the Y1 axis component and the Z1 axis component of the magnetic field measured by the first magnetic field sensor during the embodiment of the scanning artificial structure apparatus of FIG. 3 rotating around the Z1 axis of the first magnetic field sensor. In the embodiment of FIGS. 7A and 7B, the scanning artificial structure apparatus 10 rotates around the first axis (the Z1 axis) of the first magnetic field sensor 1 by 360 degrees. FIG. 7A shows the X1 axis component and the Y1 axis component of each of the first-magnetic-field-sensor-first-axis measurements $BZ1_{total\_\theta}$ in the first-magnetic-field-sensor-first-axis measurement sequence [BZ1]. FIG. 7B shows the Z1 axis component of each of the first-magnetic-field-sensor-first-axis measurements $BZ1_{total\_\theta}$ in the first-magnetic-field-sensor-first-axis measurement sequence [BZ1]. Since the actual rotation is around an axis almost coincident with the Z1 axis, there exists small variation in the elements of the first-magnetic-field-sensor-first-axis measurement sequence [BZ1] in FIG. 7B. The equation 2 above may be derived as equation 3 below:

$$BZ1_{total\_\theta} = \qquad \text{(equation 3)}$$
$$(BEarth\cos\theta + (Z1 \times BEarth)\sin\theta - Z1(Z1 \cdot BEarth)\cos\theta) +$$
$$(Z1(Z1 \cdot BEarth) + BInst1)$$

Figure 8:
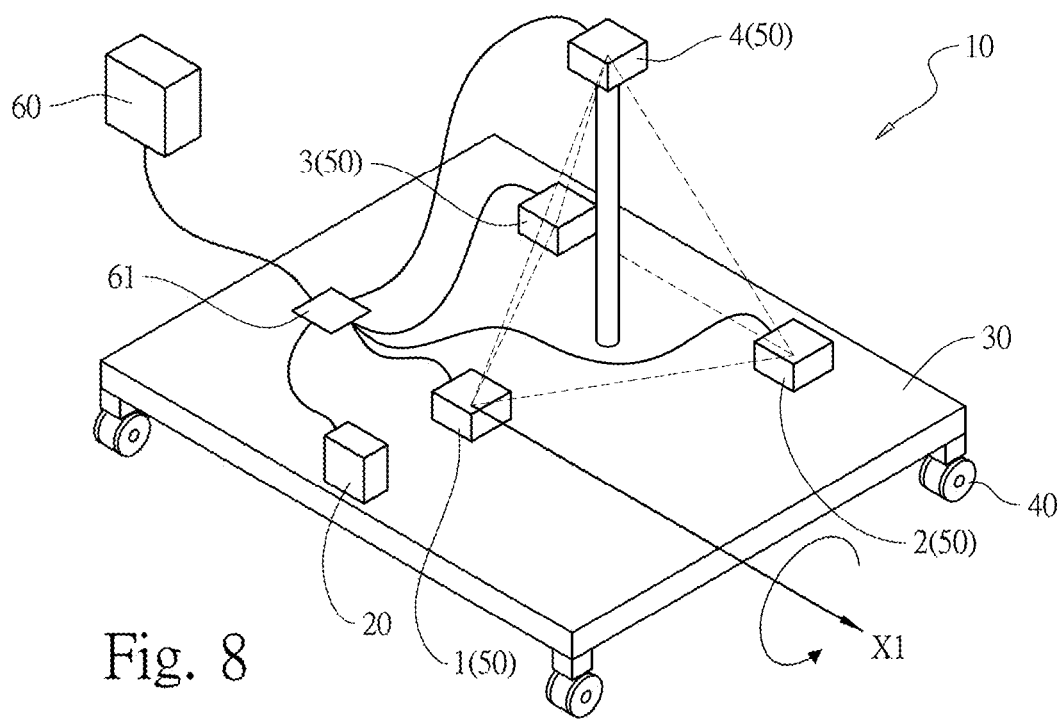
FIG. 8 is a schematic view showing the embodiment of the scanning artificial structure apparatus of FIG. 3 rotates around the X1 axis of the first magnetic field sensor.

In equation 3, (BEarth cos θ+(Z1×BEarth) sin θ−Z1 (Z1·BEarth) cos θ) is the component related to the angle θ, while (Z1(Z1·BEarth)+BInst1) is the component independent of the angle θ. Without knowing the geomagnetic field BEarth, the first instrument magnetic field measurement BInst1 cannot be calculated from Step A11. Hence, Step 12 is also required. The Step 12: (as shown in FIG. 8) rotating the scanning artificial structure apparatus 10 around the second axis of the first magnetic field sensor 1 by at least 180 degrees (in current embodiment, the second axis of the first magnetic field sensor 1 may be the X1 axis or an axis almost coincident with the X1 axis), in the meantime, measuring magnetic field by the first magnetic field sensor 1, wherein a first-magnetic-field-sensor-second-axis measurement sequence [BX1] (sequence of vectors) is measured by the first magnetic field sensor 1, wherein the second axis of the first magnetic field sensor 1 is orthogonal to the first axis of the first magnetic field sensor 1. During the scanning artificial structure apparatus 10 is rotating around the second axis of the first magnetic field sensor 1, the first-magnetic-field-sensor-second-axis measurement $BX1_{total\_\theta}$ is measured by the first magnetic field sensor 1. At different angle θ, the first-magnetic-field-sensor-second-axis measurement $BX1_{total\_\theta}$ measured by the first magnetic field sensor 1 is different. The first-magnetic-field-sensor-second-axis measurement sequence [BX1] is a sequence composed of the first-magnetic-field-sensor-second-axis measurements $BX1_{total\_\theta}$ (with different angle θ). The first-magnetic-field-sensor-second-axis measurement $BX1_{total\_\theta}$ may be derived as equation 4 below:

$$BX1_{total\_\theta} = BEarth_{rotate\_X1\_\theta} + BInst1 = \qquad \text{(equation 4)}$$
$$(BEarth\cos\theta + (X1 \times BEarth)\sin\theta +$$
$$X1(X1 \cdot BEarth)(1 - \cos\theta)) + BInst1 =$$
$$(BEarth\cos\theta + (X1 \times BEarth)\sin\theta - X1(X1 \cdot BEarth)$$
$$\cos\theta) + (X1(X1 \cdot BEarth) + BInst1)$$

In equation 4, a first-magnetic-field-sensor-second-axis measurement $BX1_{total\_\theta}$ is the total magnetic field measurement (vector) measured by the first magnetic field sensor 1 when the scanning artificial structure apparatus 10 rotated around the X1 axis of the first magnetic field sensor 1 by an angle θ. The first-magnetic-field-sensor-second-axis measurement $BX1_{total\_\theta}$ is the sum of a component of the geomagnetic field BEarth and a component of the instrument magnetic field BInst. The component of the geomagnetic field BEarth is $BEarth_{rotate\_X1\_\theta}$ (vector) which is measured by the first magnetic field sensor 1 when the scanning artificial structure apparatus 10 rotated around the X1 axis of the first magnetic field sensor 1 by the angle θ. The component of the instrument magnetic field BInst is the first instrument magnetic field measurement BInst1 which is measured by the first magnetic field sensor 1 when the scanning artificial structure apparatus 10 rotated around the X1 axis of the first magnetic field sensor 1 by the angle θ. In fact, no matter how much degree the scanning artificial structure apparatus 10 rotated around the Z1 axis of the first magnetic field sensor 1, the component of the instrument magnetic field BInst measured by the first magnetic field sensor 1 is always the first instrument magnetic field measurement BInst1. The Step A13: calculating the first instrument magnetic field measurement BInst1 from the first-magnetic-field-sensor-first-axis measurement sequence [BZ1] and the first-magnetic-field-sensor-second-axis measurement sequence [BX1].

Similarly, in the Step A0, to use the second magnetic field sensor 2 to measure the instrument magnetic field BInst generated by the scanning artificial structure apparatus 10 comprises following steps of: Step A21: rotating the scanning artificial structure apparatus 10 around the first axis (the Z2 axis) of the second magnetic field sensor 2 by at least 180 degrees, in the meantime, measuring magnetic field by the second magnetic field sensor 2, wherein a second-magnetic-field-sensor-first-axis measurement sequence [BZ2] (sequence of vectors) is measured by the second magnetic field sensor 2; Step A22: rotating the scanning artificial structure apparatus 10 around the second axis (the X2 axis) of the second magnetic field sensor 2 by at least 180 degrees, in the meantime, measuring magnetic field by the second magnetic field sensor 2, wherein a second-magnetic-field-sensor-second-axis measurement sequence [BX2] (sequence of vectors) is measured by the second magnetic field sensor 2, wherein the second axis of the second magnetic field sensor 2 is orthogonal to the first axis of the second magnetic field sensor 2; and Step A23: calculating the second instrument magnetic field measurement BInst2 from the second-magnetic-field-sensor-first-axis measurement sequence [BZ2] and the second-magnetic-field-sensor-second-axis measurement sequence [BX2]. In the Step A0, to use the third magnetic field sensor 3 to measure the instrument magnetic field BInst generated by the scanning artificial structure apparatus 10 comprises following steps of: Step A31: rotating the scanning artificial structure apparatus 10 around the first axis (the Z3 axis) of the third magnetic field sensor 3 by at least 180 degrees, in the meantime, measuring magnetic field by the third magnetic field sensor 3, wherein a third-magnetic-field-sensor-first-axis measurement sequence [BZ3] (sequence of vectors) is measured by the third magnetic field sensor 3; Step A32: rotating the scanning artificial structure apparatus 10 around the second axis (the X3 axis) of the third magnetic field sensor 3 by at least 180 degrees, in the meantime, measuring magnetic field by the third magnetic field sensor 3, wherein a third-magnetic-field-sensor-second-axis measurement sequence [BX3] (sequence of vectors) is measured by the third magnetic field sensor 3, wherein the second axis of the third magnetic field sensor 3 is orthogonal to the first axis of the third magnetic field sensor 3; and Step A33: calculating the third instrument magnetic field measurement BInst3 from the third-magnetic-field-sensor-first-axis measurement sequence [BZ3] and the third-magnetic-field-sensor-second-axis measurement sequence [BX3]. In the Step A0, to use the fourth magnetic field sensor 4 to measure the instrument magnetic field BInst generated by the scanning artificial structure apparatus 10 comprises following steps of: Step A41: rotating the scanning artificial structure apparatus 10 around the first axis (the Z4 axis) of the fourth magnetic field sensor 4 by at least 180 degrees, in the meantime, measuring magnetic field by the fourth magnetic field sensor 4, wherein a fourth-magnetic-field-sensor-first-axis measurement sequence [BZ4] (sequence of vectors) is measured by the fourth magnetic field sensor 4; Step A42: rotating the scanning artificial structure apparatus 10 around the second axis (the X4 axis) of the fourth magnetic field sensor 4 by at least 180 degrees, in the meantime, measuring magnetic field by the fourth magnetic field sensor 4, wherein a fourth-magnetic-field-sensor-second-axis measurement sequence [BX4] (sequence of vectors) is measured by the fourth magnetic field sensor 4, wherein the second axis of the fourth magnetic field sensor 4 is orthogonal to the first axis of the fourth magnetic field sensor 4; and Step A33: calculating the fourth instrument magnetic field measurement BInst4 from the fourth-magnetic-field-sensor-first-axis measurement sequence [BZ4] and the fourth-magnetic-field-sensor-second-axis measurement sequence [BX4].

In some embodiments, the positioning portion 20 is connected to the data processing portion 60 by wireless connection. In some embodiments, the first magnetic field sensor 1, the second magnetic field sensor 2, the third magnetic field sensor 3, and the fourth magnetic field sensor 4 are connected to the data processing portion 60 respectively by wireless connection. In some embodiments, the data processing portion 60 is not configured on the carrier portion 30 of the scanning artificial structure apparatus 10. In some embodiments, the moving portion 40 comprises wheels. In some embodiments, the positioning portion 20 is one selected from the group consisting of: a ranging wheel, a distance measuring equipment, a rule, a measuring tape, a laser positioning device, an ultrasonic positioning device, a radar wave positioning device, a GPS positioning device, and an image positioning device. In some embodiments, the scanning artificial structure apparatus 10 moves along the scanning path 71 within the to-be-tested area 70 by the positioning function of the positioning portion 20. In a preferred embodiment, the first magnetic field sensor 1, the second magnetic field sensor 2, the third magnetic field sensor 3, and the fourth magnetic field sensor 4 can simultaneously measure magnetic field, and the positioning portion 20 can simultaneously record the position when measuring magnetic field. Therefore, each element of the first magnetic field measurement sequence [BUC1], the second magnetic field measurement sequence [BUC2], the third magnetic field measurement sequence [BUC3], and the fourth magnetic field measurement sequence [BUC4] is corresponding to one element of the position sequence [PS] of the measured positions.

In some embodiments, the Step B comprises following steps of: calculating a first magnetic field measurement distribution BCD1 from the position sequence [PS] and a subtraction of the first instrument magnetic field measurement BInst1 from the first magnetic field measurement sequence [BUC1]; calculating a second magnetic field measurement distribution BCD2 from the position sequence [PS] and a subtraction of the second instrument magnetic field measurement BInst2 from the second magnetic field measurement sequence [BUC2]; calculating a third magnetic field measurement distribution BCD3 from the position sequence [PS] and a subtraction of the third instrument magnetic field measurement BInst3 from the third magnetic field measurement sequence [BUC3]; calculating a fourth magnetic field measurement distribution BCD4 from the position sequence [PS] and a subtraction of the fourth instrument magnetic field measurement BInst4 from the fourth magnetic field measurement sequence [BUC4]; and calculating the magnetic field variation distribution BVarD from the first magnetic field measurement distribution BCD1, the second magnetic field measurement distribution BCD2, the third magnetic field measurement distribution BCD3, and the fourth magnetic field measurement distribution BCD4.

In some embodiments, the first magnetic field sensor 1, the second magnetic field sensor 2, the third magnetic field sensor 3, and the fourth magnetic field sensor 4 are located respectively at four vertices of an equilateral-triangle-based pyramid. In some other embodiments, the first magnetic field sensor 1, the second magnetic field sensor 2, the third magnetic field sensor 3, and the fourth magnetic field sensor 4 are located respectively at four vertices of a regular tetrahedron.

Figure 9:
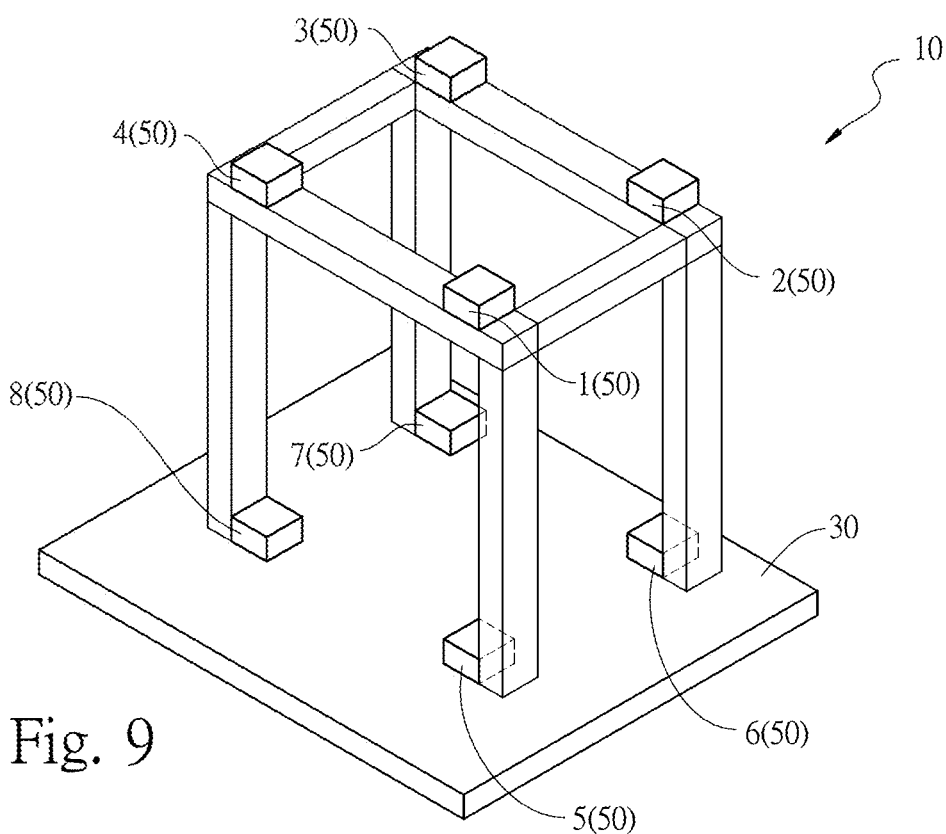
FIG. 9 is a schematic perspective view showing an embodiment of a scanning artificial structure apparatus of the present invention.

Please refer to FIG. 9, which is a schematic perspective view showing another embodiment of a scanning artificial structure apparatus of the present invention. The main structure of the embodiment of FIG. 9 is basically the same as the structure of the embodiment of FIG. 1, except that the magnetic field sensing portion 50 further comprises a fifth magnetic field sensor 5, a sixth magnetic field sensor 6, a seventh magnetic field sensor 7, and an eighth magnetic field sensor 8, wherein the first magnetic field sensor 1, the second magnetic field sensor 2, the third magnetic field sensor 3, the fourth magnetic field sensor 4, the fifth magnetic field sensor 5, the sixth magnetic field sensor 6, the seventh magnetic field sensor 7, and the eighth magnetic field sensor 8 are located respectively at eight vertices of a regular hexahedron (non-coplanar configured). In current embodiment, the method for scanning artificial structure the present invention comprises following steps of: Step A: moving the scanning artificial structure apparatus 10 along the scanning path 71 within the to-be-tested area 70, in the meantime, measuring magnetic field by the first magnetic field sensor 1, the second magnetic field sensor 2, the third magnetic field sensor 3, the fourth magnetic field sensor 4, the fifth magnetic field sensor 5, the sixth magnetic field sensor 6, the seventh magnetic field sensor 7, and the eighth magnetic field sensor 8, respectively, and recording a position sequence [PS], wherein the first magnetic field measurement sequence [BUC1] is measured by the first magnetic field sensor 1, the second magnetic field measurement sequence [BUC2] is measured by the second magnetic field sensor 2, the third magnetic field measurement sequence [BUC3] is measured by the third magnetic field sensor 3, the fourth magnetic field measurement sequence [BUC4] is measured by the fourth magnetic field sensor 4. the fifth magnetic field measurement sequence [BUC5] is measured by the sixth magnetic field measurement sequence [BUC6] is measured by the sixth magnetic field sensor, the seventh magnetic field measurement sequence [BUC7] is measured by the seventh magnetic field sensor, and the eighth magnetic field measurement sequence [BUC8] is measured by the eighth magnetic field sensor; and Step B: calculating a magnetic field variation distribution BVarD from the first magnetic field measurement sequence [BUC1], the second magnetic field measurement sequence [BUC2], the third magnetic field measurement sequence [BUC3], the fourth magnetic field measurement sequence [BUC4], the fifth magnetic field measurement sequence [BUC5], the sixth magnetic field measurement sequence [BUC6], the seventh magnetic field measurement sequence [BUC7], the eighth magnetic field measurement sequence [BUC8], and the position sequence [PS], wherein the magnetic field variation distribution BVarD is corresponding to an artificial structure distribution. In current embodiments, the magnetic field variation distribution BVarD is a magnetic field gradient-vector-magnitude distribution (scalar) which combines the position sequence [PS] and a magnetic field gradient-vector-magnitude sequence (scalar sequence) calculated from the first magnetic field measurement sequence [BUC1], the second magnetic field measurement sequence [BUC2], the third magnetic field measurement sequence [BUC3], the fourth magnetic field measurement sequence [BUC4], the fifth magnetic field measurement sequence [BUC5], the sixth magnetic field measurement sequence [BUC6], the seventh magnetic field measurement sequence [BUC7], and the eighth magnetic field measurement sequence [BUC8]. In some embodiments, the magnetic field variation distribution BVarD is a magnetic field gradient-vector distribution (vector) which combines the position sequence [PS] and a magnetic field gradient-vector sequence (vector sequence) calculated from the first magnetic field measurement sequence [BUC1], the second magnetic field measurement sequence [BUC2], the third magnetic field measurement sequence [BUC3], the fourth magnetic field measurement sequence [BUC4], the fifth magnetic field measurement sequence [BUC5], the sixth magnetic field measurement sequence [BUC6], the seventh magnetic field measurement sequence [BUC7], and the eighth magnetic field measurement sequence [BUC8]. In some embodiments, the magnetic field variation distribution BVarD is a magnetic field gradient-vector-horizontal-component distribution (vector) which combines the position sequence [PS] and a magnetic field gradient-vector-horizontal-component sequence (vector sequence) calculated from the first magnetic field measurement sequence [BUC1], the second magnetic field measurement sequence [BUC2], the third magnetic field measurement sequence [BUC3], the fourth magnetic field measurement sequence [BUC4], the fifth magnetic field measurement sequence [BUC5], the sixth magnetic field measurement sequence [BUC6], the seventh magnetic field measurement sequence [BUC7], and the eighth magnetic field measurement sequence [BUC8]. In some embodiments, the magnetic field variation distribution BVarD is a magnetic field gradient-vector-horizontal-component-magnitude distribution (scalar) which combines the position sequence [PS] and a magnetic field gradient-vector-horizontal-component-magnitude sequence (scalar sequence) calculated from the first magnetic field measurement sequence [BUC1], the second magnetic field measurement sequence [BUC2], the third magnetic field measurement sequence [BUC3], the fourth magnetic field measurement sequence [BUC4], the fifth magnetic field measurement sequence [BUC5], the sixth magnetic field measurement sequence [BUC6], the seventh magnetic field measurement sequence [BUC7], and the eighth magnetic field measurement sequence [BUC8]. To calculated the magnetic field variation distribution BVarD from the first magnetic field measurement sequence [BUC1], the second magnetic field measurement sequence [BUC2], the third magnetic field measurement sequence [BUC3], the fourth magnetic field measurement sequence [BUC4], the fifth magnetic field measurement sequence [BUC5], the sixth magnetic field measurement sequence [BUC6], the seventh magnetic field measurement sequence [BUC7], the eighth magnetic field measurement sequence [BUC8] and the position sequence [PS] of the measured positions are not limited to the above method. It is easy to calculate the magnetic field variation distribution BVarD when the first magnetic field measurement sequence [BUC1], the second magnetic field measurement sequence [BUC2], the third magnetic field measurement sequence [BUC3], the fourth magnetic field measurement sequence [BUC4], the fifth magnetic field measurement sequence [BUC5], the sixth magnetic field measurement sequence [BUC6], the seventh magnetic field measurement sequence [BUC7], the eighth magnetic field measurement sequence [BUC8] and the position sequence [PS] of the measured positions are known.

In some embodiments, the magnetic field sensing portion 50 comprises four magnetic field sensors or more than four magnetic field sensors, wherein at least four of the magnetic field sensors of the magnetic field sensing portion 50 are non-coplanar configured.

Figure 10:
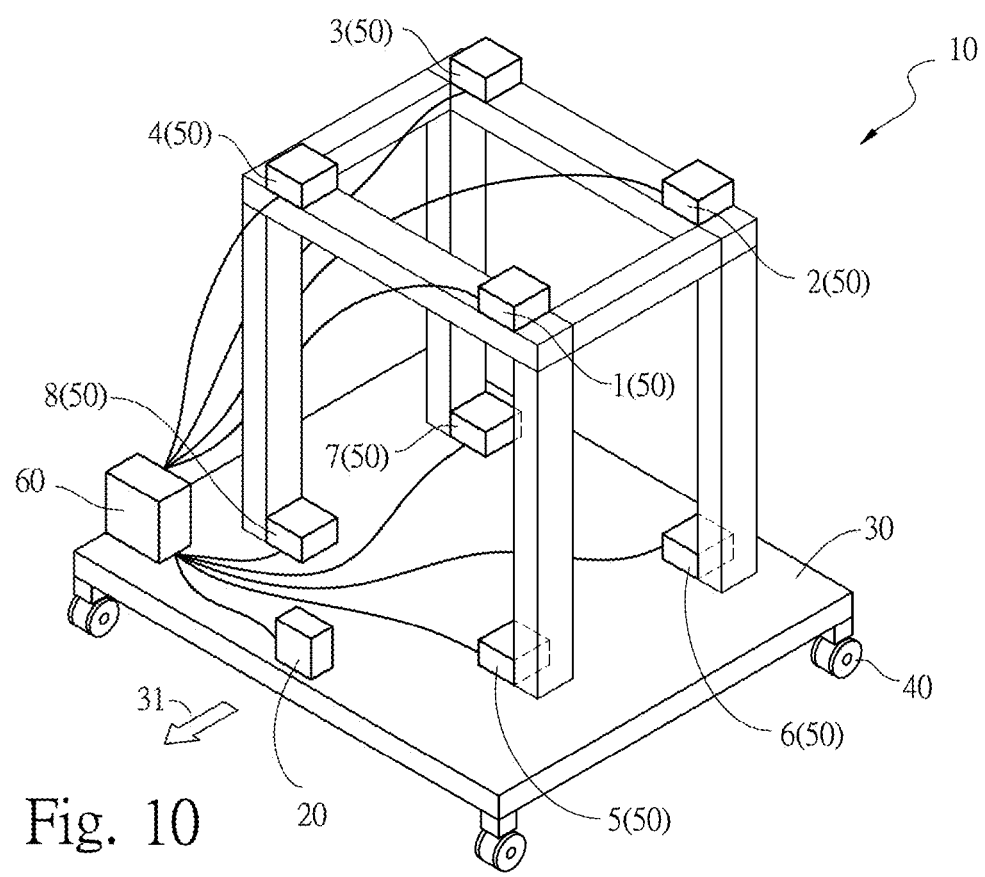
FIG. 10 is a schematic perspective view showing another embodiment of a scanning artificial structure apparatus of the present invention.
Figure 11:
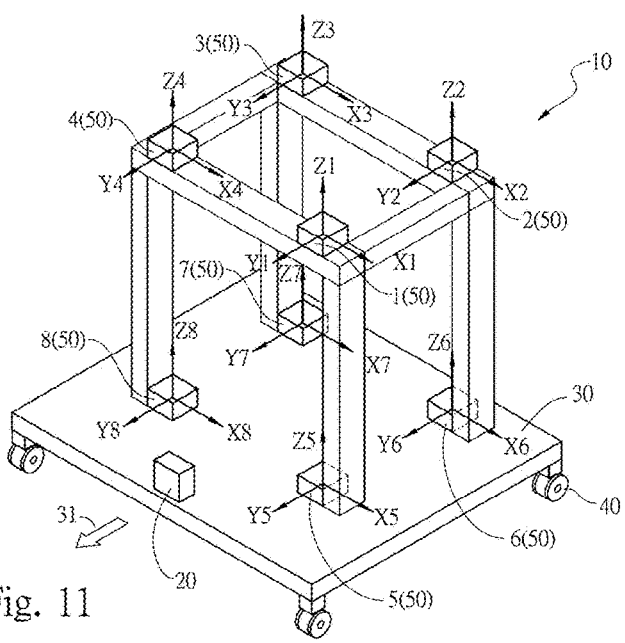
FIG. 11 is a schematic view showing three axes of each of the magnetic field sensors of the magnetic field sensing portion of the embodiment of the scanning artificial structure apparatus of FIG. 10.
Figure 12:
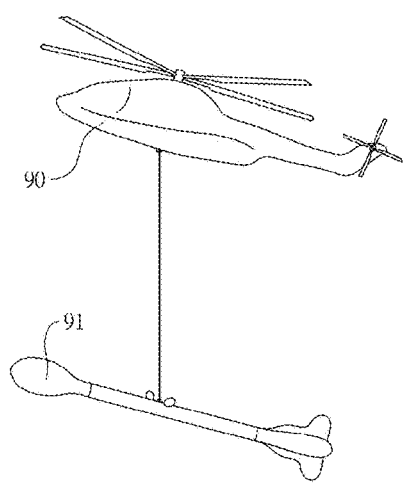
FIG. 12 is a schematic view showing the conventional technology measuring the magnetic field.

Please refer to FIG. 10, which is a schematic perspective view showing another embodiment of a scanning artificial structure apparatus of the present invention. The main structure of the embodiment of FIG. 10 is basically the same as the structure of the embodiment of FIG. 3, except that the magnetic field sensing portion 50 further comprises a fifth magnetic field sensor 5, a sixth magnetic field sensor 6, a seventh magnetic field sensor 7, and an eighth magnetic field sensor 8, wherein the first magnetic field sensor 1, the second magnetic field sensor 2, the third magnetic field sensor 3, the fourth magnetic field sensor 4, the fifth magnetic field sensor 5, the sixth magnetic field sensor 6, the seventh magnetic field sensor 7, and the eighth magnetic field sensor 8 are located respectively at eight vertices of a regular hexahedron (this part is the same as the embodiment of FIG. 9). The positioning portion 20, the first magnetic field sensor 1, the second magnetic field sensor 2, the third magnetic field sensor 3, the fourth magnetic field sensor 4, the fifth magnetic field sensor 5, the sixth magnetic field sensor 6, the seventh magnetic field sensor 7, and the eighth magnetic field sensor 8 are connected respectively to the data processing portion 60 by wire. The data processing portion 60 is used for recording the magnetic field data measured by the first magnetic field sensor 1, the second magnetic field sensor 2, the third magnetic field sensor 3, the fourth magnetic field sensor 4, the fifth magnetic field sensor 5, the sixth magnetic field sensor 6, the seventh magnetic field sensor 7, and the eighth magnetic field sensor 8 and the position data from the positioning portion 20 (or used for recording the data and processing the data). Please also refer to FIG. 11, which is a schematic view showing three axes of each of the magnetic field sensors of the magnetic field sensing portion of the embodiment of the scanning artificial structure apparatus of FIG. 10. Each of the magnetic field sensors of the magnetic field sensing portion 50 has three axes. For example, the first magnetic field sensor 1 has a X1 axis, a Y1 axis, and a Z1 axis; the second magnetic field sensor 2 has a X2 axis, a Y2 axis, and a Z2 axis; the third magnetic field sensor 3 has a X3 axis, a Y3 axis, and a Z3 axis; the fourth magnetic field sensor 4 has a X4 axis, a Y4 axis, and a Z4 axis; the fifth magnetic field sensor 5 has a X5 axis, a Y5 axis, and a Z5 axis; the sixth magnetic field sensor 6 has a X6 axis, a Y6 axis, and a Z6 axis; the seventh magnetic field sensor 7 has a X7 axis, a Y7 axis, and a Z7 axis; the eighth magnetic field sensor 8 has a X8 axis, a Y8 axis, and a Z8 axis. Similarly, the scanning artificial structure apparatus 10 of the present invention may generate the instrument magnetic field BInst, especially when the moving portion 40 is the steerable wheels with motor power. The operation of the motor may generate a magnetic field. The instrument magnetic field BInst can cause interference to each of the magnetic field sensors of the magnetic field sensing portion 50. Therefore, the interference of the instrument magnetic field BInst to each of the magnetic field sensors of the magnetic field sensing portion 50 must be removed. Hence, in current embodiments, the method for scanning artificial structure of the present invention basically has the same steps as the method in the embodiment of FIG. 9, except that it further comprises a following step of: Step A0: measuring the instrument magnetic field BInst generated by the scanning artificial structure apparatus 10 by the first magnetic field sensor 1, the second magnetic field sensor 2, the third magnetic field sensor 3, the fourth magnetic field sensor 4, the fifth magnetic field sensor 5, the sixth magnetic field sensor 6, the seventh magnetic field sensor 7, and the eighth magnetic field sensor 8, respectively, wherein the first instrument magnetic field measurement BInst1, the second instrument magnetic field measurement BInst2, the third instrument magnetic field measurement BInst3, the fourth instrument magnetic field measurement BInst4, a fifth instrument magnetic field measurement BInst5, a sixth instrument magnetic field measurement BInst6, a seventh instrument magnetic field measurement BInst7, and an eighth instrument magnetic field measurement BInst8 are measured by the first magnetic field sensor 1, the second magnetic field sensor 2, the third magnetic field sensor 3, the fourth magnetic field sensor 4, the fifth magnetic field sensor 5, the sixth magnetic field sensor 6, the seventh magnetic field sensor 7, and the eighth magnetic field sensor 8. In the Step B, the magnetic field variation distribution BVarD is calculated from a subtraction of the first instrument magnetic field measurement BInst1 from the first magnetic field measurement sequence [BUC1], a subtraction of the second instrument magnetic field measurement BInst2 from the second magnetic field measurement sequence [BUC2], a subtraction of the third instrument magnetic field measurement BInst3 from the third magnetic field measurement sequence [BUC3], a subtraction of the fourth instrument magnetic field measurement BInst4 from the fourth magnetic field measurement sequence [BUC4], a subtraction of the fifth instrument magnetic field measurement BInst5 from the fifth magnetic field measurement sequence [BUC5], a subtraction of the sixth instrument magnetic field measurement BInst6 from the sixth magnetic field measurement sequence [BUC6], a subtraction of the seventh instrument magnetic field measurement BInst7 from the seventh magnetic field measurement sequence [BUC7], a subtraction of the eighth instrument magnetic field measurement BInst8 from the eighth magnetic field measurement sequence [BUC8], and the position sequence [PS]. Thereby the interference to the first magnetic field sensor 1, the second magnetic field sensor 2, the third magnetic field sensor 3, the fourth magnetic field sensor 4, the fifth magnetic field sensor 5, the sixth magnetic field sensor 6, the seventh magnetic field sensor 7, and the eighth magnetic field sensor 8 caused by the instrument magnetic field BInst can be removed, respectively. The method for scanning artificial structure of the present invention is executed in following sequence: (1) the Step A0, the Step A, and the Step B, or (2) the Step A, the Step A0, and the Step B.

Please refer to the description above for the steps of using the first magnetic field sensor 1, the second magnetic field sensor 2, the third magnetic field sensor 3, and the fourth magnetic field sensor 4 to measure the instrument magnetic field BInst generated by the scanning artificial structure apparatus 10 in the Step A0. Similarly, in the Step A0, to use the fifth magnetic field sensor 5 to measure the instrument magnetic field BInst generated by the scanning artificial structure apparatus 10 comprises following steps of: Step A51: rotating the scanning artificial structure apparatus 10 around the first axis (the Z5 axis) of the fifth magnetic field sensor 5 by at least 180 degrees, in the meantime, measuring magnetic field by the fifth magnetic field sensor 5, wherein a fifth-magnetic-field-sensor-first-axis measurement sequence [BZ5] (sequence of vectors) is measured by the fifth magnetic field sensor 5; Step A52: rotating the scanning artificial structure apparatus 10 around the second axis (the X5 axis) of the fifth magnetic field sensor 5 by at least 180 degrees, in the meantime, measuring magnetic field by the fifth magnetic field sensor 5, wherein a fifth-magnetic-field-sensor-second-axis measurement sequence [BX5] (sequence of vectors) is measured by the fifth magnetic field sensor 5, wherein the second axis of the fifth magnetic field sensor 5 is orthogonal to the first axis of the fifth magnetic field sensor 5; and Step A53: calculating the fifth instrument magnetic field measurement BInst5 from the fifth-magnetic-field-sensor-first-axis measurement sequence [BZ5] and the fifth-magnetic-field-sensor-second-axis measurement sequence [BX5]. In the Step A0, to use the sixth magnetic field sensor 6 to measure the instrument magnetic field BInst generated by the scanning artificial structure apparatus 10 comprises following steps of: Step A61: rotating the scanning artificial structure apparatus 10 around the first axis (the Z6 axis) of the sixth magnetic field sensor 6 by at least 180 degrees, in the meantime, measuring magnetic field by the sixth magnetic field sensor 6, wherein a sixth-magnetic-field-sensor-first-axis measurement sequence [BZ6] (sequence of vectors) is measured by the sixth magnetic field sensor 6; Step A62: rotating the scanning artificial structure apparatus 10 around the second axis (the X6 axis) of the sixth magnetic field sensor 6 by at least 180 degrees, in the meantime, measuring magnetic field by the sixth magnetic field sensor 6, wherein a sixth-magnetic-field-sensor-second-axis measurement sequence [BX6] (sequence of vectors) is measured by the sixth magnetic field sensor 6, wherein the second axis of the sixth magnetic field sensor 6 is orthogonal to the first axis of the sixth magnetic field sensor 6; and Step A63: calculating the sixth instrument magnetic field measurement BInst6 from the sixth-magnetic-field-sensor-first-axis measurement sequence [BZ6] and the sixth-magnetic-field-sensor-second-axis measurement sequence [BX6]. In the Step A0, to use the seventh magnetic field sensor 7 to measure the instrument magnetic field BInst generated by the scanning artificial structure apparatus 10 comprises following steps of: Step A71: rotating the scanning artificial structure apparatus 10 around the first axis (the Z7 axis) of the seventh magnetic field sensor 7 by at least 180 degrees, in the meantime, measuring magnetic field by the seventh magnetic field sensor 7, wherein a seventh-magnetic-field-sensor-first-axis measurement sequence [BZ7] (sequence of vectors) is measured by the seventh magnetic field sensor 7; Step A72: rotating the scanning artificial structure apparatus 10 around the second axis (the X7 axis) of the seventh magnetic field sensor 7 by at least 180 degrees, in the meantime, measuring magnetic field by the seventh magnetic field sensor 7, wherein a seventh-magnetic-field-sensor-second-axis measurement sequence [BX7] (sequence of vectors) is measured by the seventh magnetic field sensor 7, wherein the second axis of the seventh magnetic field sensor 7 is orthogonal to the first axis of the seventh magnetic field sensor 7; and Step A73: calculating the seventh instrument magnetic field measurement BInst7 from the seventh-magnetic-field-sensor-first-axis measurement sequence [BZ7] and the seventh-magnetic-field-sensor-second-axis measurement sequence [BX7]. In the Step A0, to use the eighth magnetic field sensor 8 to measure the instrument magnetic field BInst generated by the scanning artificial structure apparatus 10 comprises following steps of: Step A81: rotating the scanning artificial structure apparatus 10 around the first axis (the Z8 axis) of the eighth magnetic field sensor 8 by at least 180 degrees, in the meantime, measuring magnetic field by the eighth magnetic field sensor 8, wherein an eighth-magnetic-field-sensor-first-axis measurement sequence [BZ8] (sequence of vectors) is measured by the eighth magnetic field sensor 8; Step A82: rotating the scanning artificial structure apparatus 10 around the second axis (the X8 axis) of the eighth magnetic field sensor 8 by at least 180 degrees, in the meantime, measuring magnetic field by the eighth magnetic field sensor 8, wherein an eighth-magnetic-field-sensor-second-axis measurement sequence [BX8] (sequence of vectors) is measured by the eighth magnetic field sensor 8, wherein the second axis of the eighth magnetic field sensor 8 is orthogonal to the first axis of the eighth magnetic field sensor 8; and Step A83: calculating the eighth instrument magnetic field measurement BInst8 from the eighth-magnetic-field-sensor-first-axis measurement sequence [BZ8] and the eighth-magnetic-field-sensor-second-axis measurement sequence [BX8].

In some embodiments, the Step B comprises following steps of: calculating the first magnetic field measurement distribution BCD1 from the position sequence [PS] and a subtraction of the first instrument magnetic field measurement BInst1 from the first magnetic field measurement sequence [BUC1]; calculating the second magnetic field measurement distribution BCD2 from the position sequence [PS] and a subtraction of the second instrument magnetic field measurement BInst2 from the second magnetic field measurement sequence [BUC2]; calculating the third magnetic field measurement distribution BCD3 from the position sequence [PS] and a subtraction of the third instrument magnetic field measurement BInst3 from the third magnetic field measurement sequence [BUC3]; calculating the fourth magnetic field measurement distribution BCD4 from the position sequence [PS] and a subtraction of the fourth instrument magnetic field measurement BInst4 from the fourth magnetic field measurement sequence [BUC4]; calculating a fifth magnetic field measurement distribution BCD5 from the position sequence [PS] and a subtraction of the fifth instrument magnetic field measurement BInst5 from the fifth magnetic field measurement sequence [BUC5]; calculating a sixth magnetic field measurement distribution BCD6 from the position sequence [PS] and a subtraction of the sixth instrument magnetic field measurement BInst6 from the sixth magnetic field measurement sequence [BUC6]; calculating a seventh magnetic field measurement distribution BCD7 from the position sequence [PS] and a subtraction of the seventh instrument magnetic field measurement BInst7 from the seventh magnetic field measurement sequence [BUC7]; and calculating an eighth magnetic field measurement distribution BCD8 from the position sequence [PS] and a subtraction of the eighth instrument magnetic field measurement BInst8 from the eighth magnetic field measurement sequence [BUC8]; and calculating the magnetic field variation distribution BVarD from the first magnetic field measurement distribution BCD1, the second magnetic field measurement distribution BCD2, the third magnetic field measurement distribution BCD3, the fourth magnetic field measurement distribution BCD4, the fifth magnetic field measurement distribution BCD5, the sixth magnetic field measurement distribution BCD6, the seventh magnetic field measurement distribution BCD7, and the eighth magnetic field measurement distribution BCD8.

In some embodiments, the first axis of the first magnetic field sensor 1 may be the Z1 axis or an axis almost coincident with the Z1 axis, while the second axis of the first magnetic field sensor 1 may be any axis orthogonal to the first axis of the first magnetic field sensor 1. In some embodiments, the first axis of the second magnetic field sensor 2 may be the Z2 axis or an axis almost coincident with the Z2 axis, while the second axis of the second magnetic field sensor 2 may be any axis orthogonal to the first axis of the second magnetic field sensor 2. In some embodiments, the first axis of the third magnetic field sensor 3 may be the Z3 axis or an axis almost coincident with the Z3 axis, while the second axis of the third magnetic field sensor 3 may be any axis orthogonal to the first axis of the third magnetic field sensor 3. In some embodiments, the first axis of the fourth magnetic field sensor 4 may be the Z4 axis or an axis almost coincident with the Z4 axis, while the second axis of the fourth magnetic field sensor 4 may be any axis orthogonal to the first axis of the fourth magnetic field sensor 4.

In some embodiments, the first axis of the first magnetic field sensor 1 may be any axis, while the second axis of the first magnetic field sensor 1 may be any axis orthogonal to the first axis of the first magnetic field sensor 1. In some embodiments, the first axis of the second magnetic field sensor 2 may be any axis, while the second axis of the second magnetic field sensor 2 may be any axis orthogonal to the first axis of the second magnetic field sensor 2. In some embodiments, the first axis of the third magnetic field sensor 3 may be any axis, while the second axis of the third magnetic field sensor 3 may be any axis orthogonal to the first axis of the third magnetic field sensor 3. In some embodiments, the first axis of the fourth magnetic field sensor 4 may be any axis, while the second axis of the fourth magnetic field sensor 4 may be any axis orthogonal to the first axis of the fourth magnetic field sensor 4.

In some embodiments, the first axis of the fifth magnetic field sensor 5 may be the Z5 axis or an axis almost coincident with the Z5 axis, while the second axis of the fifth magnetic field sensor 5 may be any axis orthogonal to the first axis of the fifth magnetic field sensor 5. In some embodiments, the first axis of the sixth magnetic field sensor 6 may be the Z6 axis or an axis almost coincident with the Z6 axis, while the second axis of the sixth magnetic field sensor 6 may be any axis orthogonal to the first axis of the sixth magnetic field sensor 6. In some embodiments, the first axis of the seventh magnetic field sensor 7 may be the Z7 axis or an axis almost coincident with the Z7 axis, while the second axis of the seventh magnetic field sensor 7 may be any axis orthogonal to the first axis of the seventh magnetic field sensor 7. In some embodiments, the first axis of the eighth magnetic field sensor 8 may be the Z8 axis or an axis almost coincident with the Z8 axis, while the second axis of the eighth magnetic field sensor 8 may be any axis orthogonal to the first axis of the eighth magnetic field sensor 8.

In some embodiments, the first axis of the fifth magnetic field sensor 5 may be any axis, while the second axis of the fifth magnetic field sensor 5 may be any axis orthogonal to the first axis of the fifth magnetic field sensor 5. In some embodiments, the first axis of the sixth magnetic field sensor 6 may be any axis, while the second axis of the sixth magnetic field sensor 6 may be any axis orthogonal to the first axis of the sixth magnetic field sensor 6. In some embodiments, the first axis of the seventh magnetic field sensor 7 may be any axis, while the second axis of the seventh magnetic field sensor 7 may be any axis orthogonal to the first axis of the seventh magnetic field sensor 7. In some embodiments, the first axis of the eighth magnetic field sensor 8 may be any axis, while the second axis of the eighth magnetic field sensor 8 may be any axis orthogonal to the first axis of the eighth magnetic field sensor 8.

In some embodiments, the first magnetic field sensor 1, the second magnetic field sensor 2, the third magnetic field sensor 3, the fourth magnetic field sensor 4, the fifth magnetic field sensor 5, the sixth magnetic field sensor 6, the seventh magnetic field sensor 7, and the eighth magnetic field sensor 8 are connected to the data processing portion 60 respectively by wireless connection. In some embodiments, the first magnetic field sensor 1, the second magnetic field sensor 2, the third magnetic field sensor 3, the fourth magnetic field sensor 4, the fifth magnetic field sensor 5, the sixth magnetic field sensor 6, the seventh magnetic field sensor 7, and the eighth magnetic field sensor 8 are located respectively at eight vertices of a parallelepiped. In some other embodiments, the first magnetic field sensor 1, the second magnetic field sensor 2, the third magnetic field sensor 3, the fourth magnetic field sensor 4, the fifth magnetic field sensor 5, the sixth magnetic field sensor 6, the seventh magnetic field sensor 7, and the eighth magnetic field sensor 8 are located respectively at eight vertices of a cuboid. In some embodiments, the first magnetic field sensor 1, the second magnetic field sensor 2, the third magnetic field sensor 3, the fourth magnetic field sensor 4, the fifth magnetic field sensor 5, the sixth magnetic field sensor 6, the seventh magnetic field sensor 7, and the eighth magnetic field sensor 8 are located respectively at eight vertices of a regular hexahedron.

Hence, the method for scanning artificial structure of the present invention can indeed scan the corresponding artificial structure distribution under the to-be-tested area 70, so as to facilitate the avoidance of these artificial structures during construction mining. And the feature of the present invention is that the first magnetic field sensor 1, the second magnetic field sensor 2, the third magnetic field sensor 3, the fourth magnetic field sensor 4, the fifth magnetic field sensor 5, the sixth magnetic field sensor 6, the seventh magnetic field sensor 7, and the eighth magnetic field sensor 8 of the present invention can be the semiconductor chip type magnetic field sensor which is very cheap, but is sufficient for the needs of the method for scanning artificial structure of the present invention.

As disclosed in the above description and attached drawings, the present invention can provide an apparatus and method for scanning artificial structure. It is new and can be put into industrial use.

Although the embodiments of the present invention have been described in detail, many modifications and variations may be made by those skilled in the art from the teachings disclosed hereinabove. Therefore, it should be understood that any modification and variation equivalent to the spirit of the present invention be regarded to fall into the scope defined by the appended claims.

What is claimed is:

1. A method for scanning artificial structure, wherein a scanning artificial structure apparatus comprises a magnetic field sensing portion, wherein said magnetic field sensing portion comprises a first magnetic field sensor, a second magnetic field sensor, a third magnetic field sensor, and a fourth magnetic field sensor, wherein said first magnetic field sensor, said second magnetic field sensor, said third magnetic field sensor, and said fourth magnetic field sensor are non-coplanar configured, said method comprises following steps of:

Step A0: measuring an instrument magnetic field by said first magnetic field sensor, said second magnetic field sensor, said third magnetic field sensor, and said fourth magnetic field sensor respectively, wherein said instrument magnetic field is generated by said scanning artificial structure apparatus, wherein measuring said instrument magnetic field by said first magnetic field sensor comprises following steps of:

Step A11: rotating said scanning artificial structure apparatus around a first axis of said first magnetic field sensor by at least 180 degrees, in the meantime, measuring magnetic field by said first magnetic field sensor, wherein a first-magnetic-field-sensor-first-axis measurement sequence is measured by said first magnetic field sensor;

Step A12: rotating said scanning artificial structure apparatus around a second axis of said first magnetic field sensor by at least 180 degrees, in the meantime, measuring magnetic field by said first magnetic field sensor, wherein a first-magnetic-field-sensor-second-axis measurement sequence is measured by said first magnetic field sensor, wherein said first axis of said first magnetic field sensor and said second axis of said first magnetic field sensor are nonparallel; and Step A13: calculating a first instrument magnetic field measurement from said first-magnetic-field-sensor-first-axis measurement sequence and said first-magnetic-field-sensor-second-axis measurement sequence;

wherein measuring said instrument magnetic field by said second magnetic field sensor comprises following steps of:

Step A21: rotating said scanning artificial structure apparatus around a first axis of said second magnetic field sensor by at least 180 degrees, in the meantime, measuring magnetic field by said second magnetic field sensor, wherein a second-magnetic-field-sensor-first-axis measurement sequence is measured by said second magnetic field sensor;

Step A22: rotating said scanning artificial structure apparatus around a second axis of said second magnetic field sensor by at least 180 degrees, in the meantime, measuring magnetic field by said second magnetic field sensor, wherein a second-magnetic-field-sensor-second-axis measurement sequence is measured by said second magnetic field sensor, wherein said first axis of said second magnetic field sensor and said second axis of said second magnetic field sensor are nonparallel; and Step A23: calculating a second instrument magnetic field measurement from said second-magnetic-field-sensor-first-axis measurement sequence and said second-magnetic-field-sensor-second-axis measurement sequence;

wherein measuring said instrument magnetic field by said third magnetic field sensor comprises following steps of:

Step A31: rotating said scanning artificial structure apparatus around a first axis of said third magnetic field sensor by at least 180 degrees, in the meantime, measuring magnetic field by said third magnetic field sensor, wherein a third-magnetic-field-sensor-first-axis measurement sequence is measured by said third magnetic field sensor;

Step A32: rotating said scanning artificial structure apparatus around a second axis of said third magnetic field sensor by at least 180 degrees, in the meantime, measuring magnetic field by said third magnetic field sensor, wherein a third-magnetic-field-sensor-second-axis measurement sequence is measured by said third magnetic field sensor, wherein said first axis of said third magnetic field sensor and said second axis of said third magnetic field sensor are nonparallel; and Step A33: calculating a third instrument magnetic field measurement from said third-magnetic-field-sensor-first-axis measurement sequence and said third-magnetic-field-sensor-second-axis measurement sequence;

wherein measuring said instrument magnetic field by said fourth magnetic field sensor comprises following steps of:

Step A41: rotating said scanning artificial structure apparatus around a first axis of said fourth magnetic field sensor by at least 180 degrees, in the meantime, measuring magnetic field by said fourth magnetic field sensor, wherein a fourth-magnetic-field-sensor-first-axis measurement sequence is measured by said fourth magnetic field sensor;

Step A42: rotating said scanning artificial structure apparatus around a second axis of said fourth magnetic field sensor by at least 180 degrees, in the meantime, measuring magnetic field by said fourth magnetic field sensor, wherein a fourth-magnetic-field-sensor-second-axis measurement sequence is measured by said fourth magnetic field sensor, wherein said first axis of said fourth magnetic field sensor and said second axis of said fourth magnetic field sensor are nonparallel; and Step A43: calculating a fourth instrument magnetic field measurement from said fourth-magnetic-field-sensor-first-axis measurement sequence and said fourth-magnetic-field-sensor-second-axis measurement sequence;

Step A: moving said scanning artificial structure apparatus along a scanning path within a to-be-tested area, in the meantime, measuring magnetic field by said first magnetic field sensor, said second magnetic field sensor, said third magnetic field sensor, and said fourth magnetic field sensor respectively, and recording a position sequence when measuring magnetic field, wherein a first magnetic field measurement sequence is measured by said first magnetic field sensor, a second magnetic field measurement sequence is measured by said second magnetic field sensor, a third magnetic field measurement sequence is measured by said third magnetic field sensor, and a fourth magnetic field measurement sequence is measured by said fourth magnetic field sensor; and Step B: calculating a magnetic field variation distribution from a subtraction of said first instrument magnetic field measurement from said first magnetic field measurement sequence, a subtraction of said second instrument magnetic field measurement from said second magnetic field measurement sequence, a subtraction of said third instrument magnetic field measurement from said third magnetic field measurement sequence, a subtraction of said fourth instrument magnetic field measurement from said fourth magnetic field measurement sequence, and said position sequence, wherein said magnetic field variation distribution is corresponding to at least one artificial structure distribution.

2. The method for scanning artificial structure according to claim 1,
wherein said method is executed in following sequence: (1) said Step A0, said Step A, and said Step B, or (2) said Step A, said Step A0, and said Step B.

3. The method for scanning artificial structure according to claim 1,
wherein said first axis of said first magnetic field sensor and said second axis of said first magnetic field sensor are orthogonal;
wherein said first axis of said second magnetic field sensor and said second axis of said second magnetic field sensor are orthogonal;
wherein said first axis of said third magnetic field sensor and said second axis of said third magnetic field sensor are orthogonal;
wherein said first axis of said fourth magnetic field sensor and said second axis of said fourth magnetic field sensor are orthogonal.

4. The method for scanning artificial structure according to claim 1, wherein said Step B comprises following steps of: calculating a first magnetic field measurement distribution from said position sequence and said subtraction of said first instrument magnetic field measurement from said first magnetic field measurement sequence; calculating a second magnetic field measurement distribution from said position sequence and said subtraction of said second instrument magnetic field measurement from said second magnetic field measurement sequence; calculating a third magnetic field measurement distribution from said position sequence and said subtraction of said third instrument magnetic field measurement from said third magnetic field measurement sequence; calculating a fourth magnetic field measurement distribution from said position sequence and said subtraction of said fourth instrument magnetic field measurement from said fourth magnetic field measurement sequence; and calculating said magnetic field variation distribution from said first magnetic field measurement distribution, said second magnetic field measurement distribution, said third magnetic field measurement distribution, and said fourth magnetic field measurement distribution.

5. The method for scanning artificial structure according to claim 1, wherein said magnetic field sensing portion further comprises a fifth magnetic field sensor, a sixth magnetic field sensor, a seventh magnetic field sensor, and an eighth magnetic field sensor, wherein in said Step A0, said instrument magnetic field is measured by said first magnetic field sensor, said second magnetic field sensor, said third magnetic field sensor, said fourth magnetic field sensor, said fifth magnetic field sensor, said sixth magnetic field sensor, said seventh magnetic field sensor, and said eighth magnetic field sensor respectively, wherein measuring said instrument magnetic field by said fifth magnetic field sensor comprises following steps of:

Step A51: rotating said scanning artificial structure apparatus around a first axis of said fifth magnetic field sensor by at least 180 degrees, in the meantime, measuring magnetic field by said fifth magnetic field sensor, wherein a fifth-magnetic-field-sensor-first-axis measurement sequence is measured by said fifth magnetic field sensor;

Step A52: rotating said scanning artificial structure apparatus around a second axis of said fifth magnetic field sensor by at least 180 degrees, in the meantime, measuring magnetic field by said fifth magnetic field sensor, wherein a fifth-magnetic-field-sensor-second-axis measurement sequence is measured by said fifth magnetic field sensor, wherein said first axis of said fifth magnetic field sensor and said second axis of said fifth magnetic field sensor are nonparallel; and Step A53: calculating a fifth instrument magnetic field measurement from said fifth-magnetic-field-sensor-first-axis measurement sequence and said fifth-magnetic-field-sensor-second-axis measurement sequence;

wherein measuring said instrument magnetic field by said sixth magnetic field sensor comprises following steps of:

Step A61: rotating said scanning artificial structure apparatus around a first axis of said sixth magnetic field sensor by at least 180 degrees, in the meantime, measuring magnetic field by said sixth magnetic field sensor, wherein a sixth-magnetic-field-sensor-first-axis measurement sequence is measured by said sixth magnetic field sensor;

Step A62: rotating said scanning artificial structure apparatus around a second axis of said sixth magnetic field sensor by at least 180 degrees, in the meantime, measuring magnetic field by said sixth magnetic field sensor, wherein a sixth-magnetic-field-sensor-second-axis measurement sequence is measured by said sixth magnetic field sensor, wherein said first axis of said sixth magnetic field sensor and said second axis of said sixth magnetic field sensor are nonparallel; and Step A63: calculating a sixth instrument magnetic field measurement from said sixth-magnetic-field-sensor-first-axis measurement sequence and said sixth-magnetic-field-sensor-second-axis measurement sequence;

wherein measuring said instrument magnetic field by said seventh magnetic field sensor comprises following steps of:

Step A71: rotating said scanning artificial structure apparatus around a first axis of said seventh magnetic field sensor by at least 180 degrees, in the meantime, measuring magnetic field by said seventh magnetic field sensor, wherein a seventh-magnetic-field-sensor-first-axis measurement sequence is measured by said seventh magnetic field sensor;

Step A72: rotating said scanning artificial structure apparatus around a second axis of said seventh magnetic field sensor by at least 180 degrees, in the meantime, measuring magnetic field by said seventh magnetic field sensor, wherein a seventh-magnetic-field-sensor-second-axis measurement sequence is measured by said seventh magnetic field sensor, wherein said first axis of said seventh magnetic field sensor and said second axis of said seventh magnetic field sensor are nonparallel; and Step A73: calculating a seventh instrument magnetic field measurement from said seventh-magnetic-field-sensor-first-axis measurement sequence and said seventh-magnetic-field-sensor-second-axis measurement sequence;

wherein measuring said instrument magnetic field by said eighth magnetic field sensor comprises following steps of:

Step A81: rotating said scanning artificial structure apparatus around a first axis of said eighth magnetic field sensor by at least 180 degrees, in the meantime, measuring magnetic field by said eighth magnetic field sensor, wherein an eighth-magnetic-field-sensor-first-axis measurement sequence is measured by said eighth magnetic field sensor;

Step A82: rotating said scanning artificial structure apparatus around a second axis of said eighth magnetic field sensor by at least 180 degrees, in the meantime, measuring magnetic field by said eighth magnetic field sensor, wherein an eighth-magnetic-field-sensor-second-axis measurement sequence is measured by said eighth magnetic field sensor, wherein said first axis of said eighth magnetic field sensor and said second axis of said eighth magnetic field sensor are nonparallel; and Step A83: calculating a eighth instrument magnetic field measurement from said eighth-magnetic-field-sensor-first-axis measurement sequence and said eighth-magnetic-field-sensor-second-axis measurement sequence;

wherein said Step A further comprises a following step of: measuring magnetic field by said fifth magnetic field sensor, said sixth magnetic field sensor, said seventh magnetic field sensor, and said eighth magnetic field sensor respectively during moving said scanning artificial structure apparatus, wherein a fifth magnetic field measurement sequence is measured by said fifth magnetic field sensor, a sixth magnetic field measurement sequence is measured by said sixth magnetic field sensor, a seventh magnetic field measurement sequence is measured by said seventh magnetic field sensor, and an eighth magnetic field measurement sequence is measured by said eighth magnetic field sensor; wherein in said Step B, said magnetic field variation distribution is calculated from said subtraction of said first instrument magnetic field measurement from said first magnetic field measurement sequence, said subtraction of said second instrument magnetic field measurement from said second magnetic field measurement sequence, said subtraction of said third instrument magnetic field measurement from said third magnetic field measurement sequence, said subtraction of said fourth instrument magnetic field measurement from said fourth magnetic field measurement sequence, a subtraction of said fifth instrument magnetic field measurement from said fifth magnetic field measurement sequence, a subtraction of said sixth instrument magnetic field measurement from said sixth magnetic field measurement sequence, a subtraction of said seventh instrument magnetic field measurement from said seventh magnetic field measurement sequence, a subtraction of said eighth instrument magnetic field measurement from said eighth magnetic field measurement sequence, and said position sequence.

6. The method for scanning artificial structure according to claim 5,
wherein said method is executed in following sequence: (1) said Step A0, said Step A, and said Step B, or (2) said Step A, said Step A0, and said Step B.

7. The method for scanning artificial structure according to claim 5,
wherein said first axis of said first magnetic field sensor and said second axis of said first magnetic field sensor are orthogonal;
wherein said first axis of said second magnetic field sensor and said second axis of said second magnetic field sensor are orthogonal;
wherein said first axis of said third magnetic field sensor and said second axis of said third magnetic field sensor are orthogonal;
wherein said first axis of said fourth magnetic field sensor and said second axis of said fourth magnetic field sensor are orthogonal;
wherein said first axis of said fifth magnetic field sensor and said second axis of said fifth magnetic field sensor are orthogonal;
wherein said first axis of said sixth magnetic field sensor and said second axis of said sixth magnetic field sensor are orthogonal;
wherein said first axis of said seventh magnetic field sensor and said second axis of said seventh magnetic field sensor are orthogonal;
wherein said first axis of said eighth magnetic field sensor and said second axis of said eighth magnetic field sensor are orthogonal.

8. The method for scanning artificial structure according to claim 5, wherein said Step B comprises following steps of: calculating a first magnetic field measurement distribution from said position sequence and said subtraction of said first instrument magnetic field measurement from said first magnetic field measurement sequence; calculating a second magnetic field measurement distribution from said position sequence and said subtraction of said second instrument magnetic field measurement from said second magnetic field measurement sequence; calculating a third magnetic field measurement distribution from said position sequence and said subtraction of said third instrument magnetic field measurement from said third magnetic field measurement sequence; calculating a fourth magnetic field measurement distribution from said position sequence and said subtraction of said fourth instrument magnetic field measurement from said fourth magnetic field measurement sequence; calculating a fifth magnetic field measurement distribution from said position sequence and said subtraction of said fifth instrument magnetic field measurement from said fifth magnetic field measurement sequence; calculating a sixth magnetic field measurement distribution from said position sequence and said subtraction of said sixth instrument magnetic field measurement from said sixth magnetic field measurement sequence; calculating a seventh magnetic field measurement distribution from said position sequence and said subtraction of said seventh instrument magnetic field measurement from said seventh magnetic field measurement sequence; and calculating an eighth magnetic field measurement distribution from said position sequence and said subtraction of said eighth instrument magnetic field measurement from said eighth magnetic field measurement sequence; and calculating said magnetic field variation distribution from said first magnetic field measurement distribution, said second magnetic field measurement distribution, said third magnetic field measurement distribution, said fourth magnetic field measurement distribution, said fifth magnetic field measurement distribution, said sixth magnetic field measurement distribution, said seventh magnetic field measurement distribution, and said eighth magnetic field measurement distribution.

9. The method for scanning artificial structure according to claim 5, wherein said first magnetic field sensor, said second magnetic field sensor, said third magnetic field sensor, said fourth magnetic field sensor, said fifth magnetic field sensor, said sixth magnetic field sensor, said seventh magnetic field sensor, and said eighth magnetic field sensor are located respectively at eight vertices of a parallelepiped, located respectively at eight vertices of a cuboid, or located respectively at eight vertices of a regular hexahedron.

10. The method for scanning artificial structure according to claim 1, wherein said first magnetic field sensor, said second magnetic field sensor, said third magnetic field sensor, and said fourth magnetic field sensor are located respectively at four vertices of an equilateral-triangle-based pyramid or located respectively at four vertices of a regular tetrahedron.

11. The method for scanning artificial structure according to claim 1, wherein said magnetic field variation distribution is a magnetic field gradient-vector distribution, a magnetic field gradient-vector-magnitude distribution, a magnetic field gradient-vector-horizontal-component distribution, or a magnetic field gradient-vector-horizontal-component-magnitude distribution.

12. The method for scanning artificial structure according to claim 1, wherein said scanning artificial structure apparatus further comprises a positioning portion.

13. The method for scanning artificial structure according to claim 12, wherein said positioning portion is one selected from the group consisting of: a ranging wheel, a distance measuring equipment, a rule, a measuring tape, a laser positioning device, an ultrasonic positioning device, a radar wave positioning device, a GPS positioning device, and an image positioning device.

14. A scanning artificial structure apparatus comprising:
a magnetic field sensing portion, wherein said magnetic field sensing portion comprises a first magnetic field sensor, a second magnetic field sensor, a third magnetic field sensor, and a fourth magnetic field sensor, wherein said first magnetic field sensor, said second magnetic field sensor, said third magnetic field sensor, and said fourth magnetic field sensor are non-coplanar configured; and wherein said scanning artificial structure apparatus is for performing said method for scanning artificial structure according to claim 1.

15. The scanning artificial structure apparatus according to claim 14, wherein said magnetic field sensing portion further comprises a fifth magnetic field sensor, a sixth magnetic field sensor, a seventh magnetic field sensor, and an eighth magnetic field sensor, wherein said scanning artificial structure apparatus is for performing said method for scanning artificial structure according to claim 5.

16. The scanning artificial structure apparatus according to claim 15, wherein said first magnetic field sensor, said second magnetic field sensor, said third magnetic field sensor, said fourth magnetic field sensor, said fifth magnetic field sensor, said sixth magnetic field sensor, said seventh magnetic field sensor, and said eighth magnetic field sensor are located respectively at eight vertices of a parallelepiped, located respectively at eight vertices of a cuboid, or located respectively at eight vertices of a regular hexahedron.

17. The scanning artificial structure apparatus according to claim 14, wherein said first magnetic field sensor, said second magnetic field sensor, said third magnetic field sensor, and said fourth magnetic field sensor are located respectively at four vertices of an equilateral-triangle-based pyramid or located respectively at four vertices of a regular tetrahedron.

18. The scanning artificial structure apparatus according to claim 14, further comprising a positioning portion.

19. The scanning artificial structure apparatus according to claim 18, wherein said positioning portion is one selected from the group consisting of: a ranging wheel, a distance measuring equipment, a rule, a measuring tape, a laser positioning device, an ultrasonic positioning device, a radar wave positioning device, a GPS positioning device, and an image positioning device.

20. The scanning artificial structure apparatus according to claim 14, further comprising a moving portion.

* * * * *